MACHINES FOR MOUNTING ELECTRONIC COMPONENTS

Filed Feb. 13, 1957 15 Sheets-Sheet 1

Inventors
William E. Stolecki
Vincent P. Romeo
Charles P. Cardani
Charles K. Woodman
By their Attorney
Thomas J. Ryan Inventors
William E. Stolecki
Vincent P. Romeo
Charles P. Cardani
Charles K. Woodman
By their Attorney
Thomas J. Ryan Inventors
William E. Stolecki
Vincent P. Romeo
Charles P. Cardani
Charles K. Woodman
By their Attorney
Thomas J. Ryan Inventors
William E. Stolecki
Vincent P. Romeo
Charles P. Cardani
Charles K. Woodman
By their Attorney
Thomas J. Ryan

MACHINES FOR MOUNTING ELECTRONIC COMPONENTS

Filed Feb. 13, 1957 15 Sheets-Sheet 5

Inventors
William E. Stolecki
Vincent P. Romeo
Charles P. Cardani
Charles K. Woodman
By their Attorney
Thomas J. Ryan

MACHINES FOR MOUNTING ELECTRONIC COMPONENTS

Filed Feb. 13, 1957 15 Sheets-Sheet 6

Inventors
William E. Stolecki
Vincent P. Romeo
Charles P. Cardani
Charles K. Woodman
By their Attorney
Thomas J. Ryan Sept. 15, 1959 W. STOLECKI ET AL 2,903,698

MACHINES FOR MOUNTING ELECTRONIC COMPONENTS

Filed Feb. 13, 1957 15 Sheets-Sheet 7

Inventors
William E. Stolecki
Vincent P. Romeo
Charles P. Cardani
Charles K. Woodman
By their Attorney
Thomas J. Ryan

MACHINES FOR MOUNTING ELECTRONIC COMPONENTS

Filed Feb. 13, 1957 15 Sheets-Sheet 8

Inventors
William E. Stolecki
Vincent P. Romeo
Charles P. Cardani
Charles K. Woodman
By their Attorney
Thomas J. Ryan Sept. 15, 1959 W. STOLECKI ET AL 2,903,698

MACHINES FOR MOUNTING ELECTRONIC COMPONENTS

Filed Feb. 13, 1957 15 Sheets-Sheet 9

Inventors
William E. Stolecki
Vincent P. Romeo
Charles P. Cardani
Charles K. Woodman
By their Attorney
Thomas J Ryan

MACHINES FOR MOUNTING ELECTRONIC COMPONENTS

Filed Feb. 13, 1957

Inventors
William E. Stolecki
Vincent P. Romeo
Charles P. Cardani
Charles K. Woodman
By their Attorney
Thomas J. Ryan

MACHINES FOR MOUNTING ELECTRONIC COMPONENTS

Filed Feb. 13, 1957 15 Sheets-Sheet 11

Inventors
William E. Stolecki
Vincent P. Romeo
Charles P. Cardani
Charles K. Woodman
By their Attorney
Thomas J. Ryan

MACHINES FOR MOUNTING ELECTRONIC COMPONENTS

Filed Feb. 13, 1957

Inventors
William E.Stolecki
Vincent P.Romeo
Charles P.Cardani
Charles K.Woodman
By their Attorney
Thomas J. Ryan Inventors
William E. Stolecki
Vincent P. Romeo
Charles P. Cardani
Charles K. Woodman
By their Attorney
Thomas J. Ryan

MACHINES FOR MOUNTING ELECTRONIC COMPONENTS

Inventors
William E. Stolecki
Vincent P. Romeo
Charles P. Cardani
Charles K. Woodman
By their Attorney
Thomas J. Ryan Inventors
William E. Stolecki
Vincent P. Romeo
Charles P. Cardani
Charles K. Woodman
By their Attorney
Thomas J. Ryan United States Patent Office 2,903,698

Patented Sept. 15, 1959

2,903,698

MACHINES FOR MOUNTING ELECTRONIC COMPONENTS

William Stolecki, Beverly, Vincent P. Romeo, Danvers, Charles P. Cardani, Hamilton, and Charles K. Woodman, Beverly, Mass., assignors to United Shoe Machinery Corporation, Flemington, N.J., a corporation of New Jersey Application February 13, 1957, Serial No. 640,010

15 Claims. (Cl. 1—2)

This invention relates to machines for mounting components, and more particularly to machines for feeding, centralizing, forming and then inserting the oppositely extending leads of successive electronic components in work pieces such as circuit boards. The invention is more especially illustrated herein as applied to a machine adapted to secure on a circuit board components which have been belted in row formation and have body dimensions up to about one inch in diameter or thickness and up to about three inches in length. Accordingly, while it will be recognized that the exemplary machine shown herein is capable of installing axial lead type electronic components larger than those characteristic of the commercial half and one watt resistor sizes (as well as components of those sizes), it is to be noted that in its various aspects the invention is not limited in use to the illustrative machine, nor to operation on linked components or on components of any particular size or type, but may even be applied to machines for installing nonelectrical components.

In a copending application, Serial No. 458,312, filed September 27, 1954, in the names of Leon D. Alderman, Charles P. Cardani, Edwin S. Kant, and Henry B. Kimball, there is disclosed a machine for installing axial lead type components. That machine, whether operated individually or at one of a series of stations on an automatic, conveyorized assembly line such as is disclosed, for example, in United States Letters Patent No. 2,772,416, granted December 4, 1956, in the names of Adolph S. Dorosz and Thomas W. Snow, has been found to be of great value in rapidly cutting, forming and inserting the coaxial leads of what may be termed the smaller electronic components, i.e., one-half and one watt resistors and the like. These smaller components normally have bodies of one-quarter inch in diameter or less and are one inch or less in length. When electronic components of larger size are to be mechanically fed and formed, new problems incidental to their control arise necessitating novel techniques for insuring their connection into the circuits in reliable manner. Among the difficulties usually encountered in dealing with the larger components may be mentioned the eccentricity with which their leads extend from their bodies, the irregularity of their body shapes and measurements and the heavier protective coatings of wax and other materials which make feeding and positioning difficult.

In view of the foregoing, it is a primary object of this invention to provide an improved machine for installing components, said machine to be versatile, highly dependable in performance, and particularly well adapted to effect installation of both the smaller components and the larger components having body dimensions of up to about one by three inches. To this end, and in accordance with various novel features of the invention, there is provided, in combination with means for forming and inserting the leads of successive components in a work piece, this means being adaptable to form the leads of a component with selected leg spacing, component feeding mechanism including lead centralizing means for presenting each component with its leads alined and predeterminedly positioned with respect to the forming and inserting means of a machine shown herein by way of illustration. Those aspects more directly related to the feeding of components, although fully disclosed herein, constitute the subject matter and claims of a copending application Serial No. 753,233, filed August 5, 1958.

Other features of this invention reside in the provision, in a component inserting machine of the type having a raceway for guiding belted components to forming and inserting instrumentalities, of mechanism for centralizing the leads of each component while transferring it to the forming instrumentalities, means for stripping successive components from belted relation in the raceway to advance them to the centralizing mechanism, and means for operating the centralizing and stripping mechanisms in time relation to the operation of the forming and inserting instrumentalities.

Further features of the invention consist in the provision of novel means for introducing successive components from a belted condition into a position to be operated upon by forming and inserting tools, the last-named means comprising movably mounted, V-shaped elements arranged releasably to receive the leads of each component, power means for cyclically oscillating the V-shaped elements to transfer each component into position to be operated upon, and mechanism controlled by the power means for stripping a component from belted relation each time the V-shaped elements are retracted from the tools to receive a previously stripped component to be inserted.

The above and other features of the invention, including novel details of construction and combinations of parts, will now be more fully described with regard to an illustrative component inserting machine in which the invention is emboded and with reference to the accompanying drawings thereof, in which.

Figure 1:
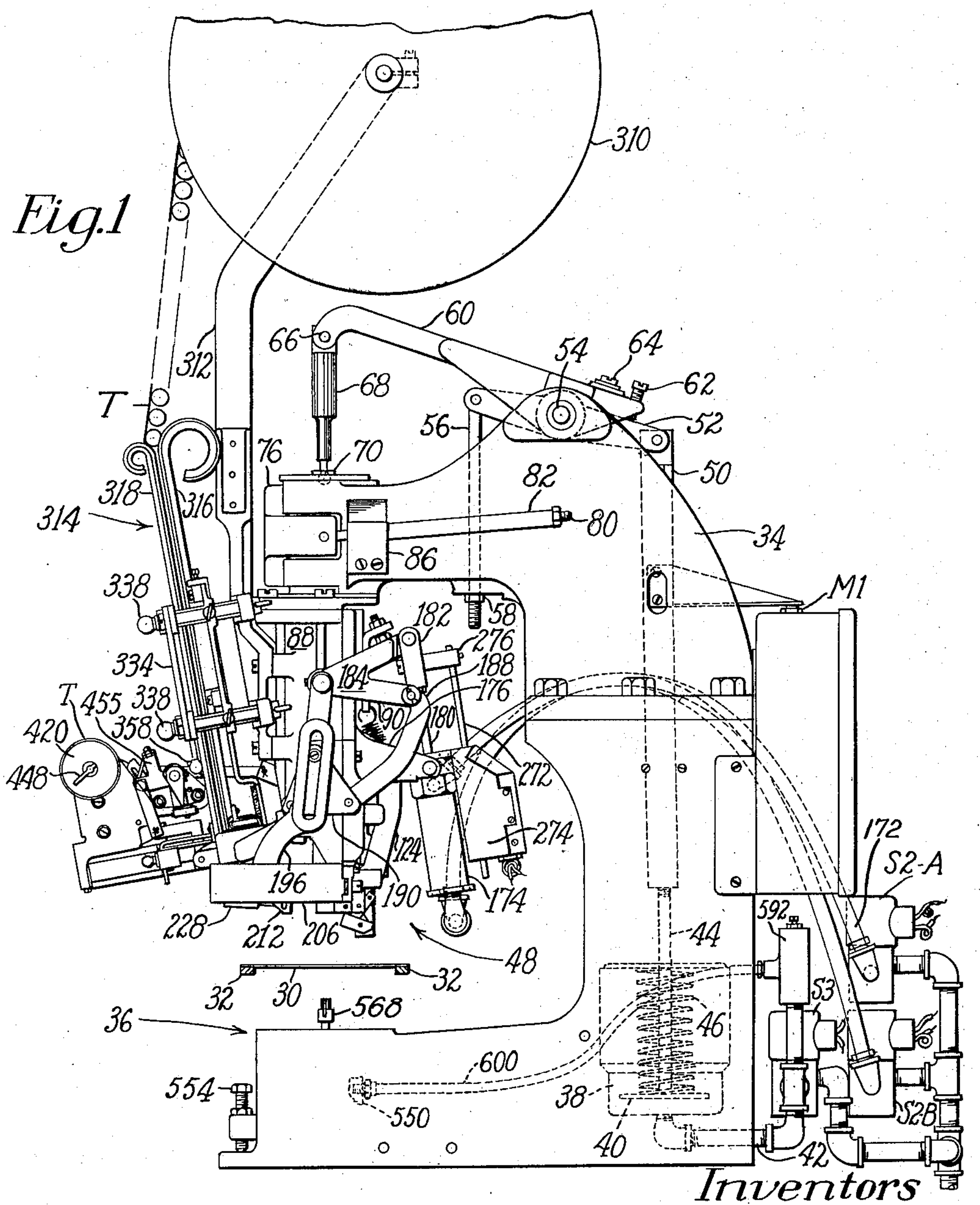
Fig. 1 is a view in side elevation of an exemplary machine in rest position for installing components on circuit boards.
Figure 4:
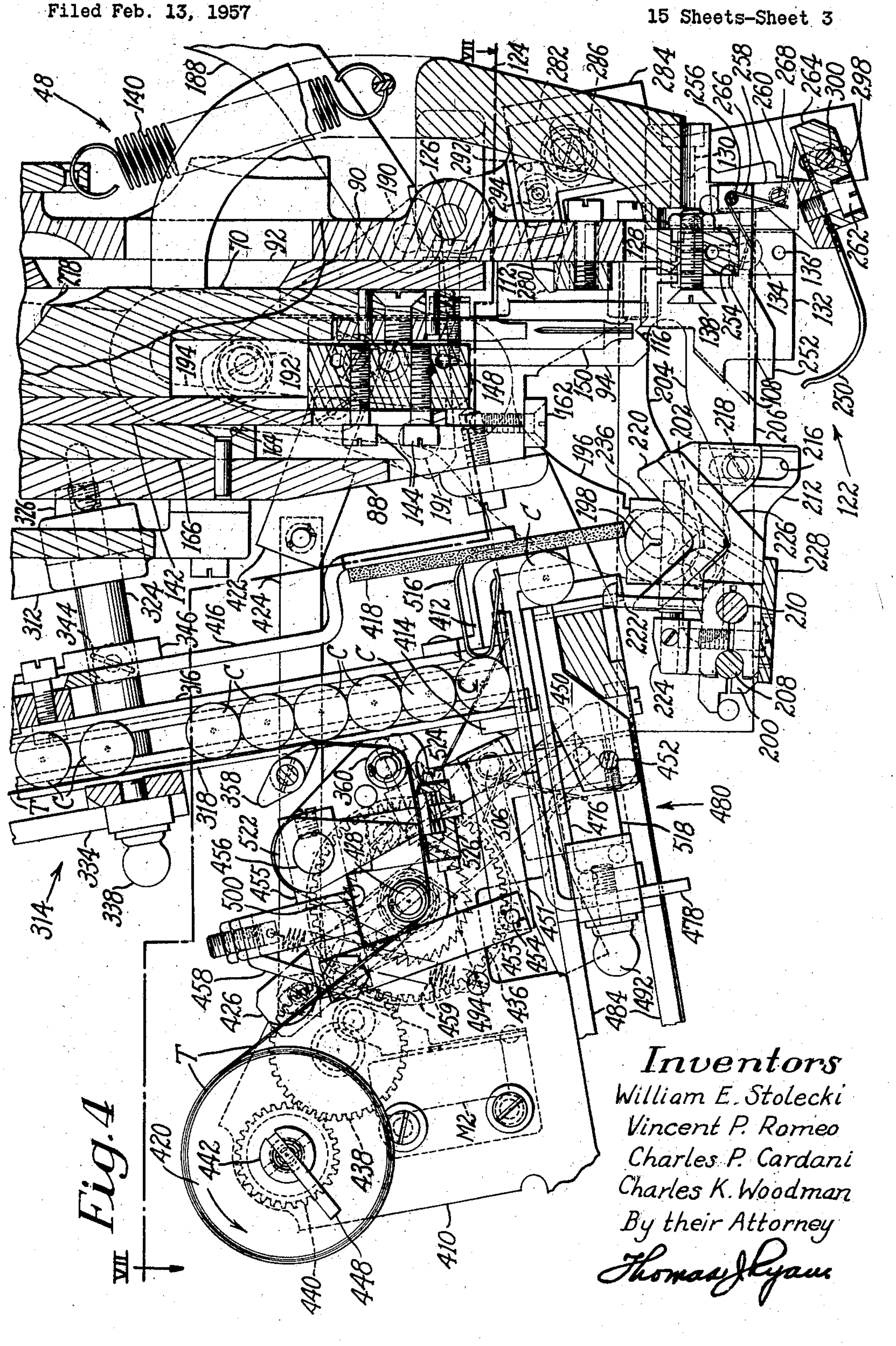
Fig. 4 is a further enlarged view of tape feeding means and the lower portion of the head shown in Fig. 2 but at a different stage in its cycle, portions being broken away to show details of construction, and a component being deposited into mechanism for presenting it to lead centralizing and forming means in the head.
Figure 5:
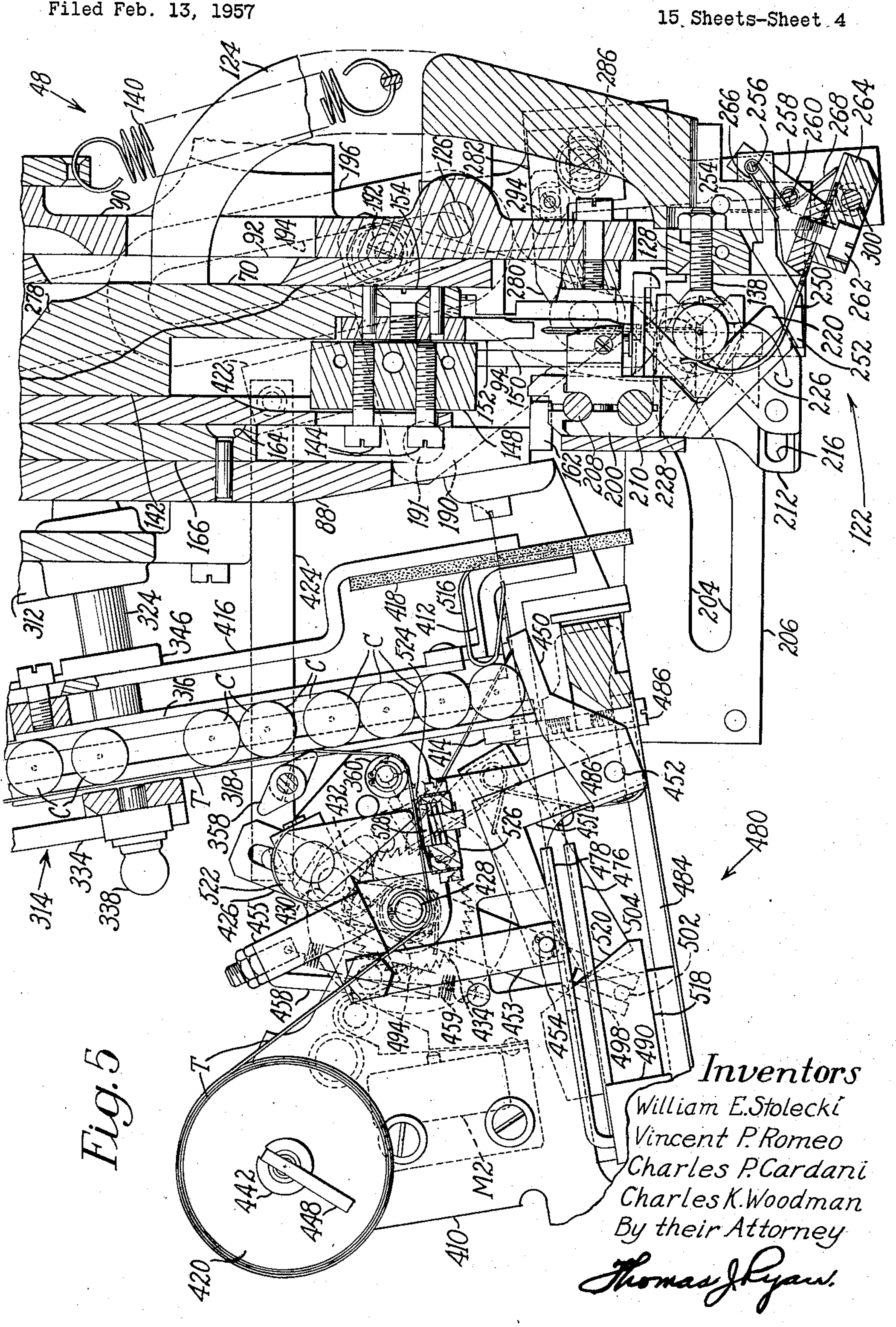
Fig. 5 is a view corresponding to Fig. 4, but at that stage in a cycle of operations when a component has been presented to the lead centralizing and forming means.
Figures 10, 11, 11A, 12:
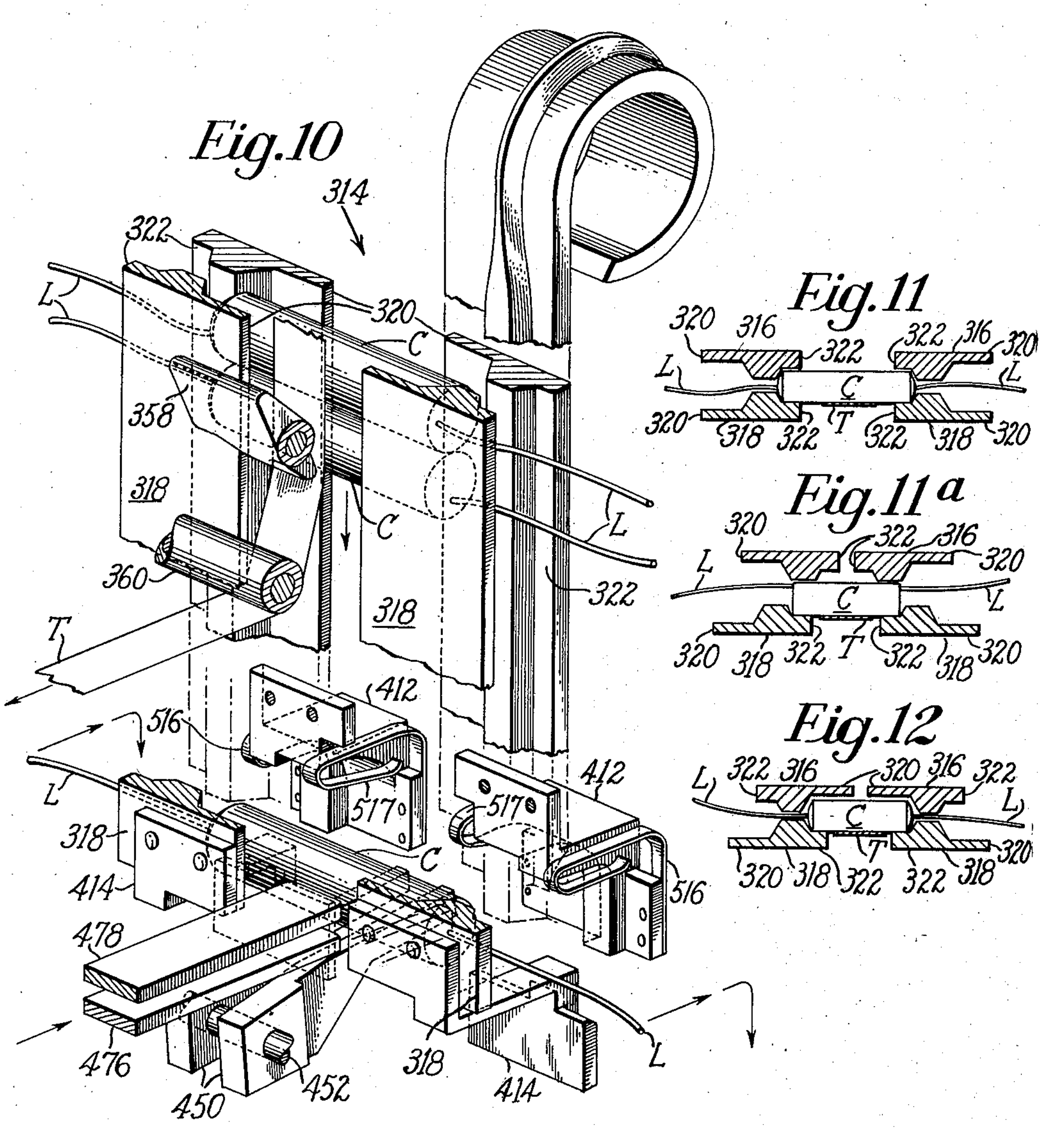
Fig. 10 is an exploded perspective of a portion of component feeding and tape stripping means.
Fig. 11 is a horizontal section taken through four reversible guides constituting the raceway shown in Fig. 10.
Figure 13:
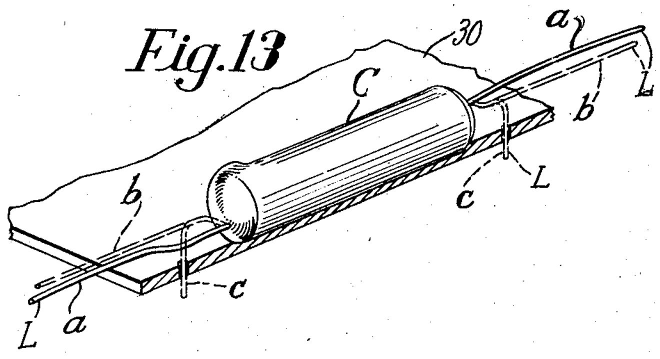
Figure 14:
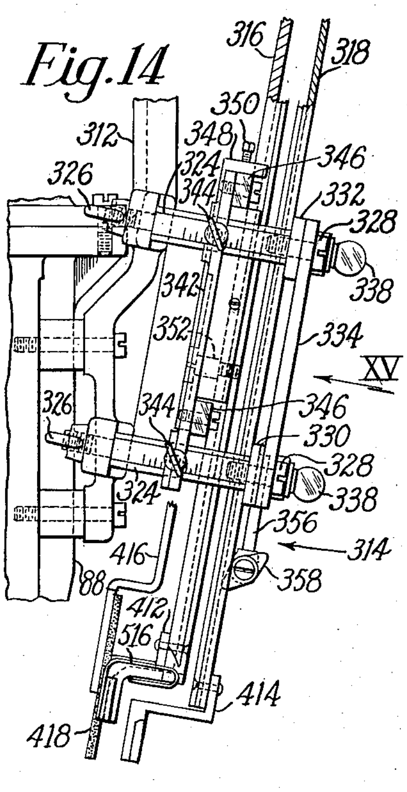
Figure 15:
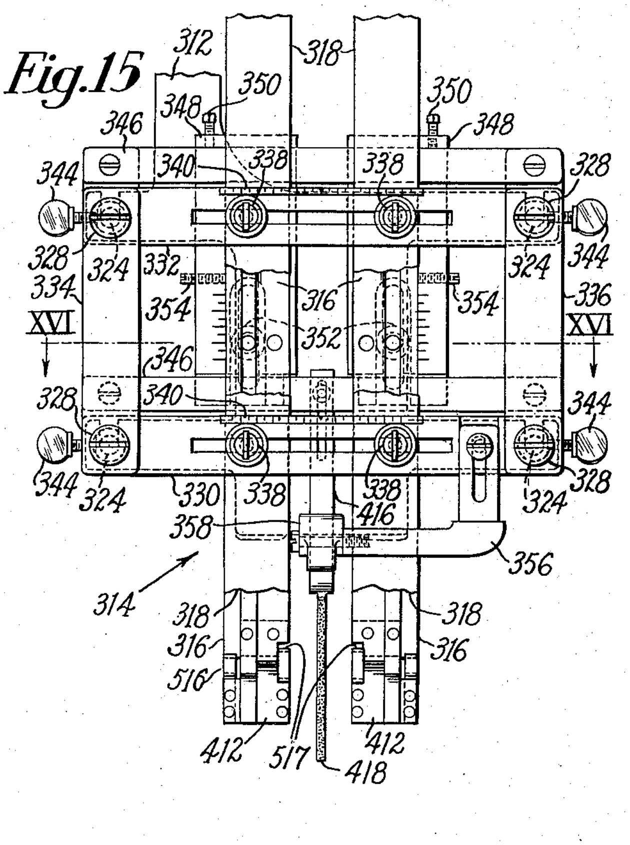
Figure 16:
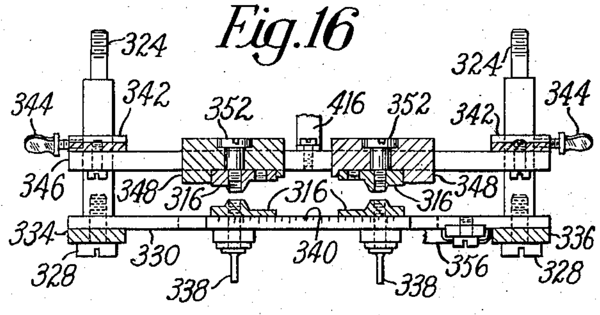
Figure 17:
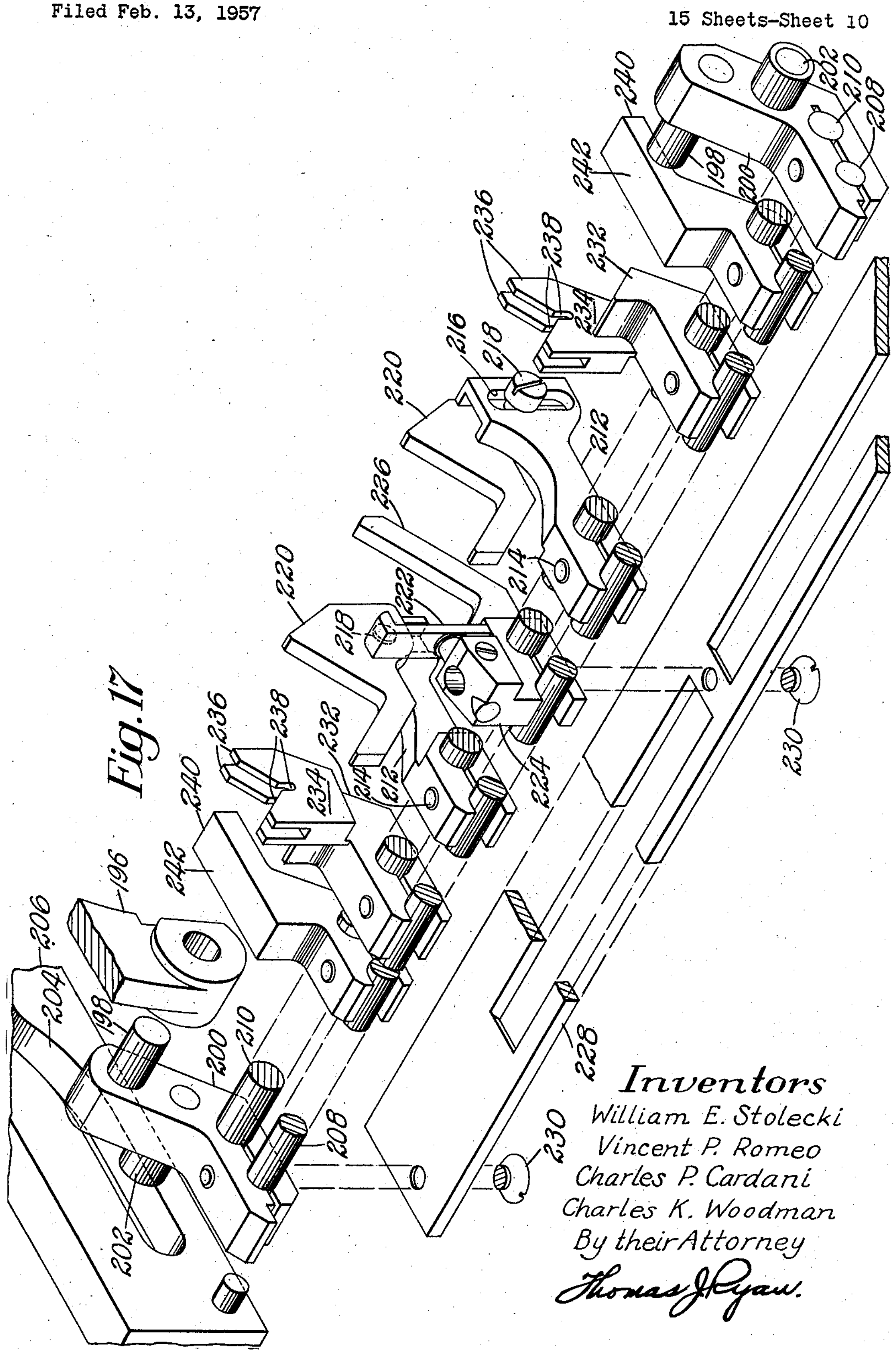
Figure 18:
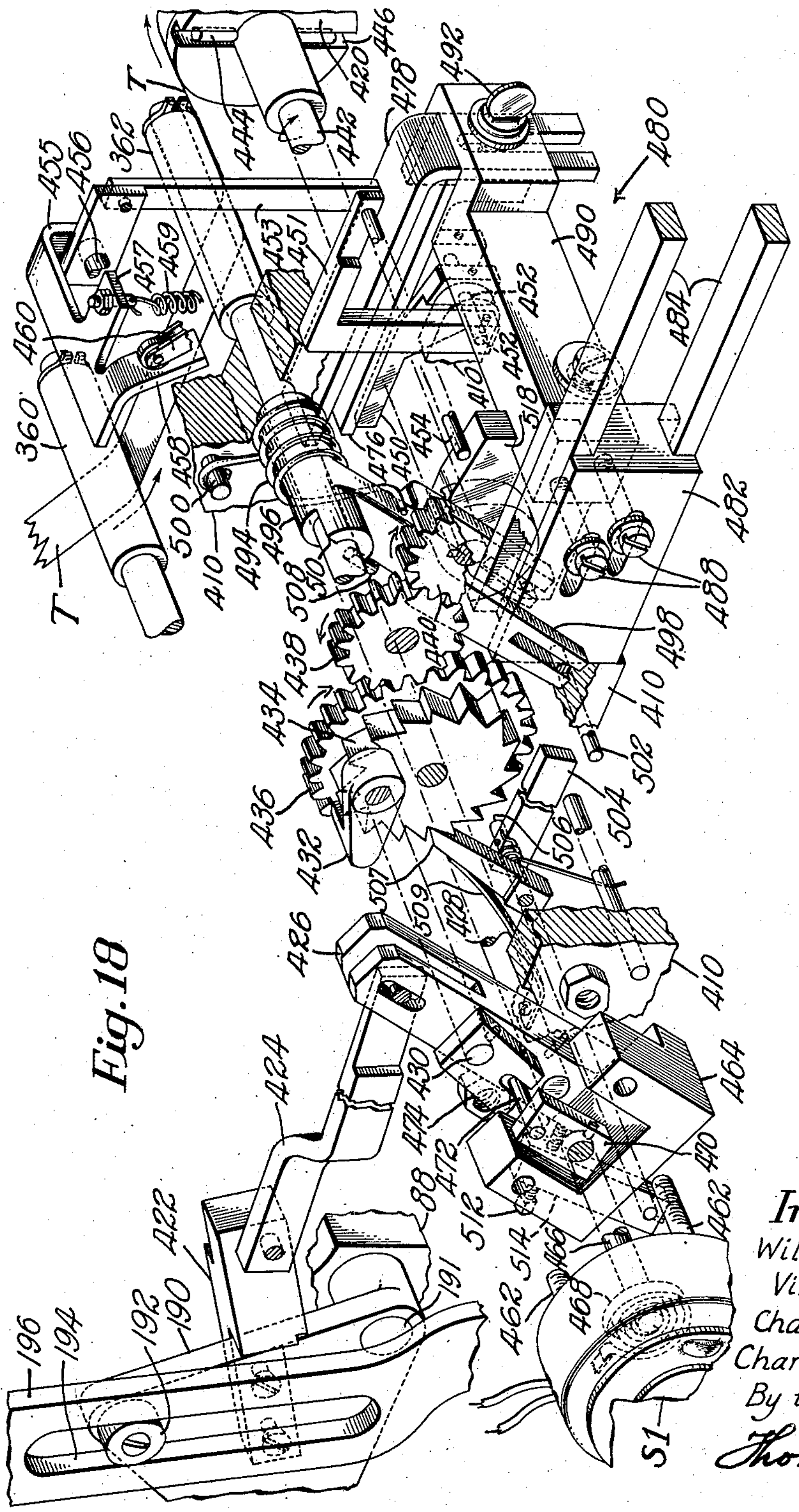
Figures 19, 20:
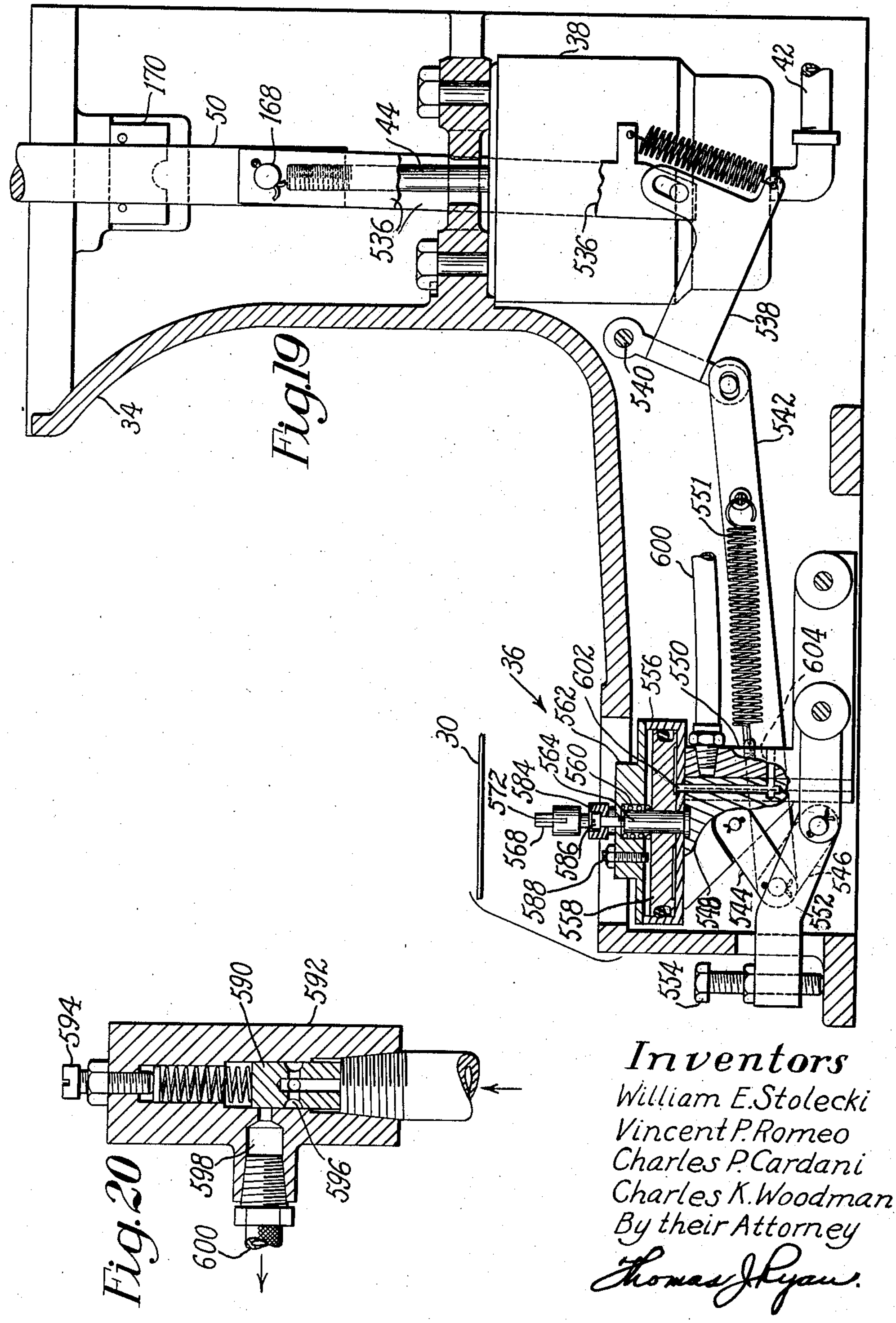
Figures 21, 22:
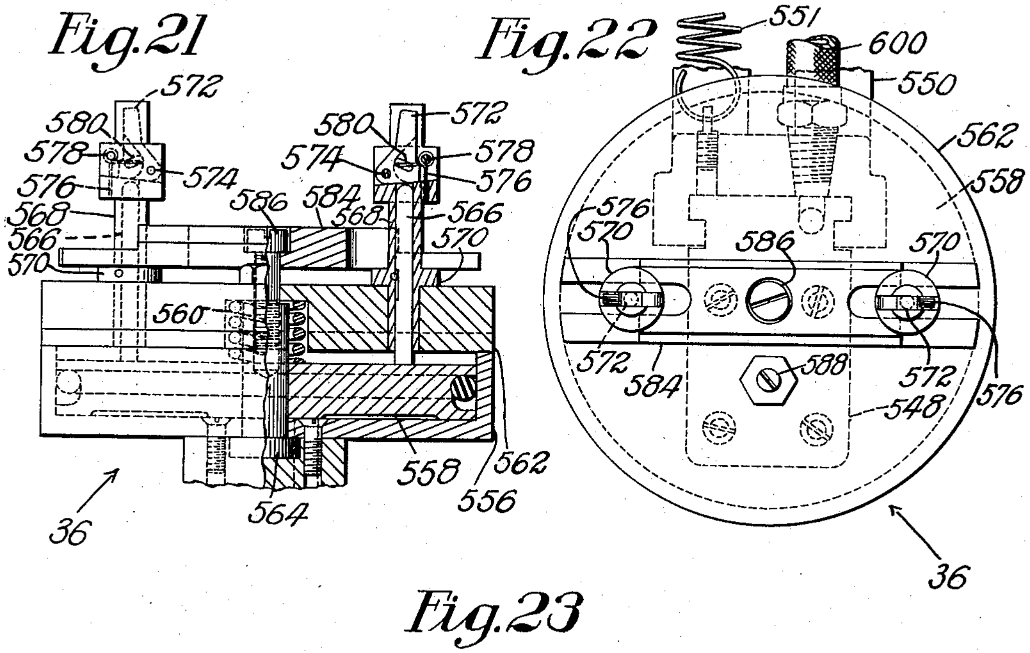
Figure 23:
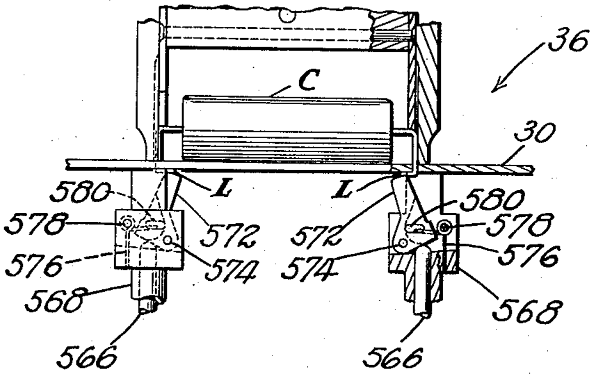
Figures 24, 25:
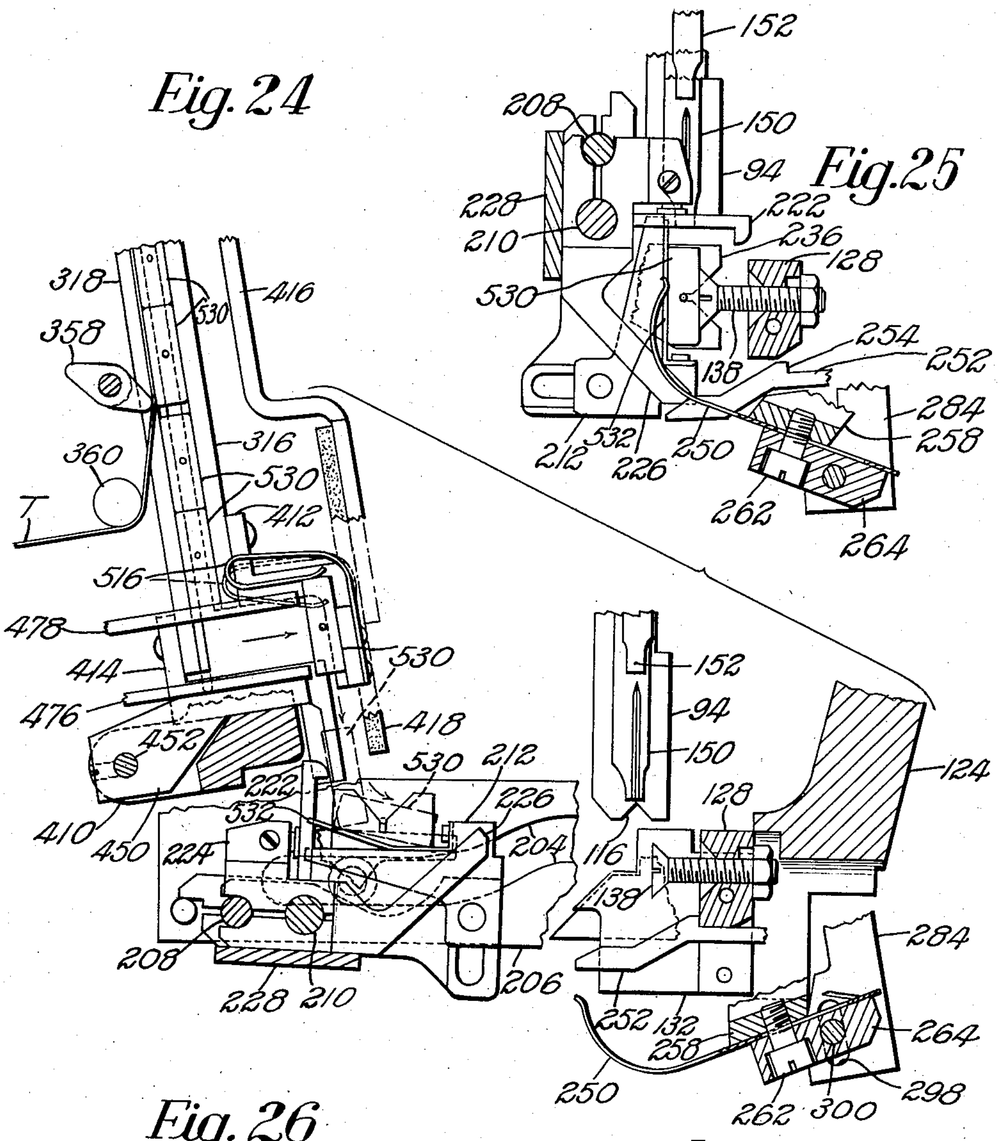
Figure 26:
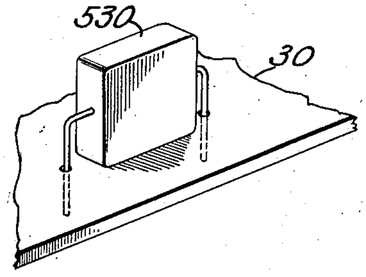
Figure 27:
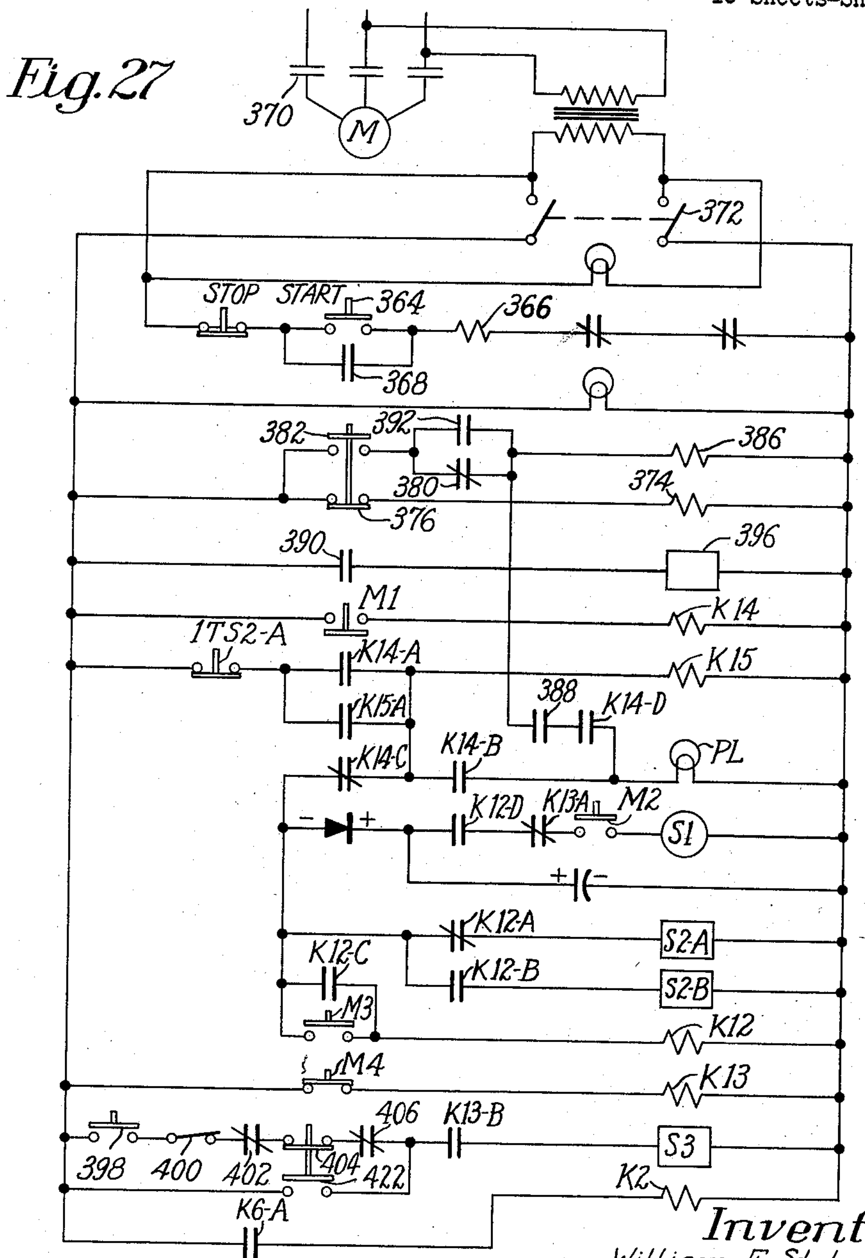

Fig. 11*a* is a view similar to Fig. 11, but showing a revised arrangement of two of the guides preferred when leads extend in other than coaxial relation from component bodies;

Fig. 12 is a section corresponding with that of Fig. 11, but indicating the guides in rearranged position for accommodating a shorter component than shown in Fig. 11;

Fig. 13 is a perspective view of a typical cylindrical component such as a resistor or condenser to be installed by this machine, full lines showing the way in which initially crooked leads project from eccentric points in the ends of the body, dotted lines indicating the lead centralizing and straightening performed in the machine prior to forming for insertion, and other dotted lines showing the centralized leads when cut and inserted, but not clinched;

Fig. 14 is a view in side elevation, as seen from the side opposite to that shown in Fig. 1, and showing adjustability in the mounting of the raceway guides to accommodate different diameters or thicknesses of component bodies;

Fig. 15 is a view looking in the direction of an arrow XV in Fig. 14, and illustrating adjustability in the mounting of the raceway guides for accommodating component bodies of different lengths;

Fig. 16 is a section taken on the line XVI—XVI of Fig. 15;

Fig. 17 is an exploded perspective view of the parts comprising the component presenting and lead centralizing means;

Fig. 18 is an exploded perspective view of the tape and component feeding means and showing its operating connection and disengaging means, the parts being in positions corresponding to those shown in Fig. 4;

Fig. 19 is an enlarged vertical section of the base of the machine shown in Fig. 1, including anvil mechanism for securing an inserted component on the circuit board;

Fig. 20 is a vertical section of a pressure buildup valve shown in Fig. 1 for operating the anvil mechanism shown in Fig. 19;

Fig. 21 is a view in elevation on an enlarged scale and partly in section showing the anvil mechanism of Fig. 19 as seen from the front of the machine;

Fig. 22 is a plan view of the anvil mechanism of Fig. 21;

Fig. 23 is a detail view in elevation and partly in section showing a component inserted by the machine and about to be clinched;

Fig. 24 is a view in side elevation and partly in section, with a portion broken away, corresponding to parts shown in Fig. 4 and as adapted to deal with mica-mold type components;

Fig. 25 is a view corresponding to a portion of Fig. 5 and showing the mica-mold component after being presented from its position indicated in Fig. 24;

Fig. 26 is a perspective view of a mica-mold type capacitor after being installed in a wiring board by the machine, but before lead clinching; and Fig. 27 is a schematic wiring diagram showing a control system for the illustrative machine when mounted in an automatic conveyorized assembly system.

The illustrative machine, like that disclosed in the Alderman et al. application mentioned, is shown and described herein as adapted for automatic operation at a station of a conveyorized assembly line of the type disclosed in the Dorosz et al. patent referred to above, but is, with minor modifications, also suitable for independent operation under mutual control or indeed in other automatic assembly systems. Also, though operation of the illustrative machine will be explained assuming that the components are fed by means of a single tape belting their bodies in row formation, it will be understood that the components may be otherwise connected, or the components may simply be fed one-by-one into a raceway or directly to component feed carriage means mounted on the machine. Any suitable supporting means may be employed for holding a work piece such as a circuit board 30 (Figs. 1, 13 and 23) in appropriate component receiving position, it sufficing for present purposes merely to show the board mounted on supports 32, 32. Accordingly, work carrying pallets, together with means for clamping them at conveyor stations, are not herein shown.

Figures 2, 3:
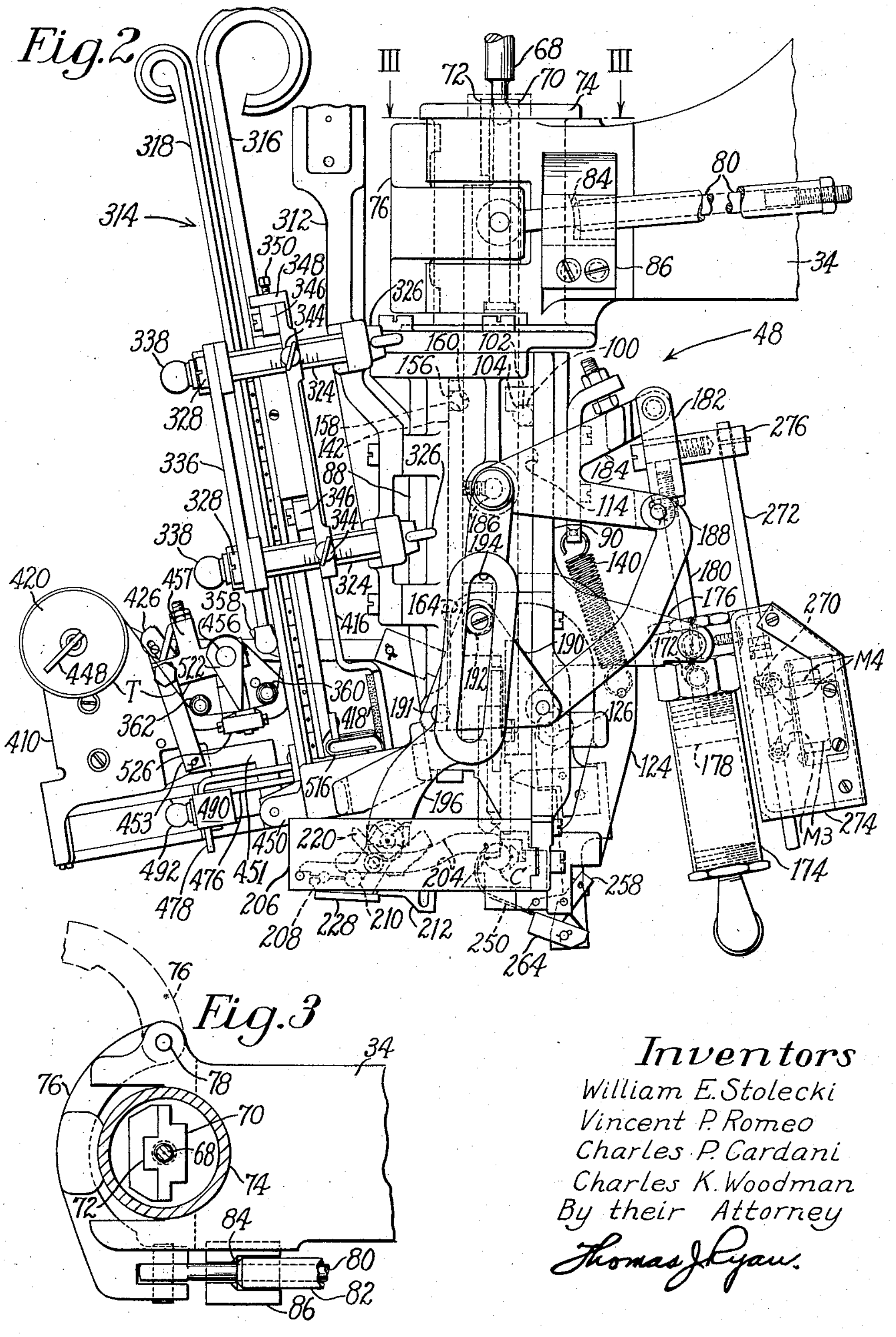
Fig. 2 is a view of the machine head as seen in Fig. 1 and on a larger scale.
Fig. 3 is a section taken on the line III—III in Fig. 2 and indicating means by which the machine head is removably clamped to the main frame.

The machine includes a main, hollow, C-shaped frame 34 (Figs. 1, 2 and 19) housing in the front of its base later-described lead clinching mechanism generally designated 36 (Figs. 19 and 21 to 23), and at the rear of its base an air motor 38 (Figs. 1 and 19). The latter is provided with a vertically movable piston 40 and connected via a pipe 42 to a source of air under pressure for operating a piston rod 44 heightwise against the resistance of a return spring 46 (Fig. 1). The head of the machine is generally designated 48 (Figs. 1, 2, 4 and 5) and removably clamped to an overhanging portion of the frame 34 as will be explained. For operating lead cutting, forming and inserting instrumentalities of the head 48, the rod 44 is threaded into a link 50 (Fig. 1), the upper end of which is pivotally conneceted to one end of a lever 52 fulcrumed at 54 in the frame 34. Depending from the other end of the lever 52 is a link 56 slidably extending through a bore formed in the frame and threadedly carrying a nut 58 for engaging the frame and thus determining the limit of clockwise movement, as viewed in Fig. 1, of the lever 52 and a lever 60 operated thereby. This lever 60 is also fulcrumed at 54 and its initial angular relation to the lever 52 is adjustably determined by a screw 62 threaded through the lever 60 and engaging the lever 52 endwise. A screw 64 slidably extending through a slot (not shown) formed in the lever 60 is threaded into the lever 52 and serves to move the lever 60 clockwise, as viewed in Fig. 1, when the spring 46 is permitted to move the lever 52 clockwise. A pivot pin 66 (Fig. 1) in the front end of the lever 60 connects the latter to a ball-ended link 68 (Figs. 1, 2 and 3) which is nested in the upper end of a component inserting bar 70 (Figs. 2, 3, 4 and 8) and secured thereto by a spherically recessed plate 72 (Figs. 2 and 3).

The head 48 next to be described, upon removal of the pin 66, is completely detachable from the frame 34 and thus renders its parts accessible for inspection or repair, as well as conveniently enabling a head to be interchanged with another when desired. For this purpose a cylindrical sleeve 74 (Figs. 2 and 3), constituting the upper portion of the head, is provided with upper and lower supporting flanges and detachably clamped in a semi-circular bearing formed in the overhanging portion of the frame 34, an arcuate bearing clamp 76 pivoted on the frame at 78 (Fig. 3) being swingable into latching position by means of a rod 80 pivoted on the clamp. The rod 80 (Figs. 2 and 3) has threaded thereon a handle 82 having one end arranged, when the clamp is closed and the rod 80 is lowered into horizontal position, to engage an arcuate surface 84 of a latch 86 secured on the frame 34. Thus not only may the machine as a whole be positionally adjusted at its operating station by any suitable means, but the head 48 by itself may, upon unlatching the clamp 76, be pivoted about a vertical axis to insure registry of the leads as formed in the machine with lead receiving points or holes in a work piece such as the circuit board 30.

Figure 7:
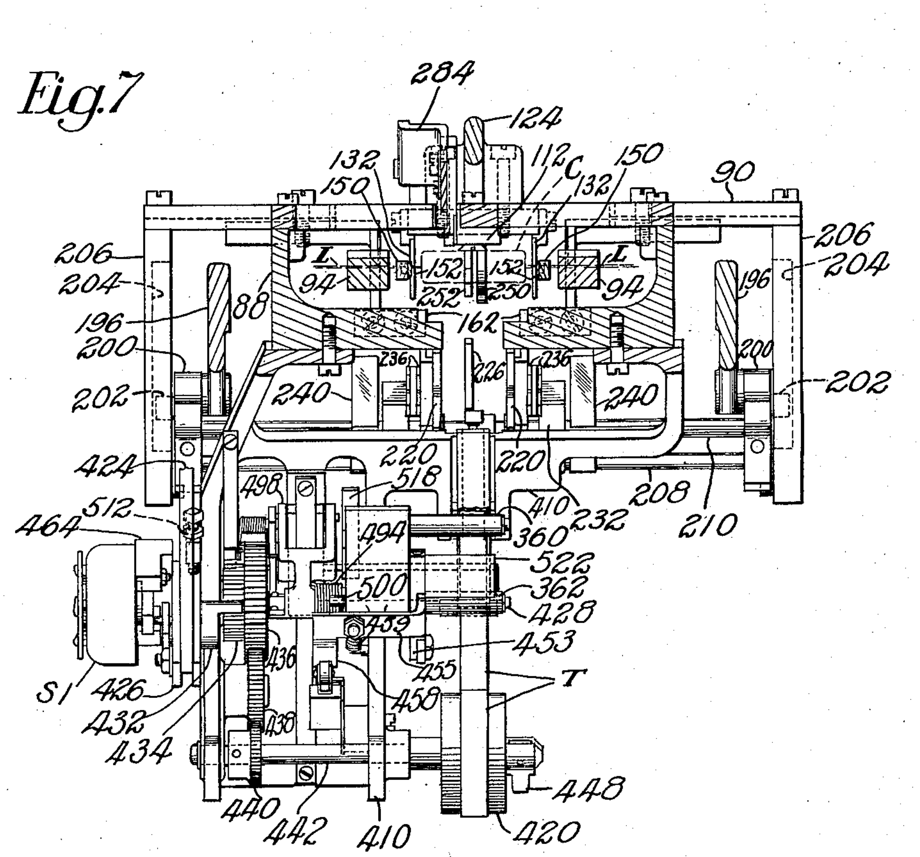
Fig. 7 is a section taken on the broken line VII—VII of Fig. 4, the raceway and certain parts associated therewith being omitted to reveal other structure.

Secured to the lower flange of the sleeve 74 is a head casing 88 (Figs. 1, 2, 4 and 5) generally U-shaped in cross section and largely enclosing the lead cutting, forming and inserting tools about to be described. The rearward open portion of the casing is bridged by a cover plate 90 (Figs. 2 and 7) secured thereto thus providing a vertical guideway for the inserting bar 70. The tools and their operations resemble to some extent those in the cited Alderman et al. application, but important distinctions will be noted which simplify construction, afford added range in adjustability, and are especially adapted to enable the machine to deal with irregularities and inconsistencies often common to larger, commercially available axial lead components. In order to sever the leads L, if need be, of each component C to be inserted, a knife holder 92 (Figs. 4, 5 and 8) is mounted for vertical reciprocable movement on the rearward side of the inserting bar 70 as controlled by the cyclical operation of the latter. For this purpose, a pair of shear bars 94, 94 (Fig. 8) are respectively secured to the holder by tongue and groove arrangement for widthwise adjustment, clamping bolts 96 threaded into the bars extending in horizontal slots 98 formed in the holder, and the holder is releasably coupled to the bar 70 to partake of its vertical movement. Thus the upper end of the holder is formed with a bore 100 of a size adapted to accommodate a major portion of a ball-type detent 102. As shown in Fig. 2, when the shear bars are in their retracted or rest position, this detent is nested partly in the bore 100 and partly in a spherical recess 104 formed in the rear side of the inserting bar 70. The holder 92 is accordingly caused to descend with the inserting bar until the bars 94, 94 have cut the leads of a component (which is presented by means herein later explained) in cooperation with surfaces 106, 106 of a pair of shear blocks 108, 108 (Figs. 4, 8 and 17), respectively. The arrangement is such that when the leads have been trimmed and the holder 92 arrested by its surface 110 (Fig. 8) engaging a block 112 secured to the cover plate 90, continuous downward movement of the inserting bar 70 is permitted, the ball detent 102 being cammed rearwardly and partly into a spherical recess 114 (Fig. 2) formed in the cover plate. The shear bars 94 are preferably formed with V-shaped centralizing notches 116, 116 (Fig. 8), respectively, in accord with the teaching of United States Letters Patent No. 2,748,388, granted June 5, 1956, in the name of Charles P. Cardani. To enable the surfaces 106 to be adjusted widthwise, i.e., in the direction of the length of the leads of a component, for register with the shear bars 94, each of the blocks 108 has a tongue portion slidable in a horizontal groove of the cover plate 90 and provided with a series of threaded bores 118 one of which receives a screw 120 extending through the plate.

Figure 9:
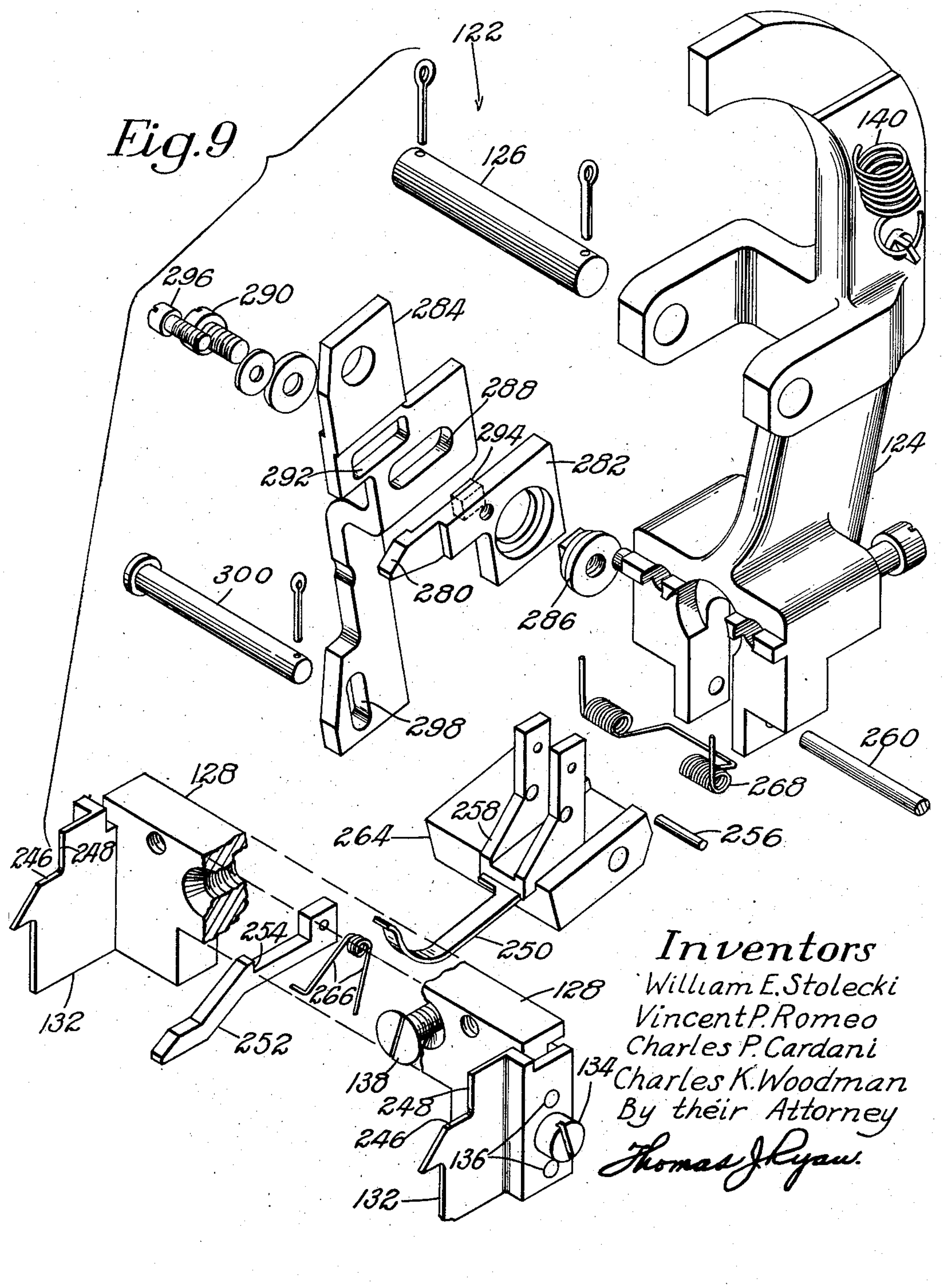
Fig. 9 is an exploded perspecitve and enlarged view of an inside former and associated parts shown in Fig. 8.

Cooperating with the component presenting means above referred to and hereinafter to be explained, is an inside former unit generally designated 122 (Figs. 4, 8 and 9) consisting of an inside former lever 124 pivoted on a pin 126 in the cover plate 90, a spacer block 128 secured to the lever 124 by a pair of screws 130 (one shown in Fig. 4), and a pair of inside formers 132, 132 secured to the ends respectively of the block by a screw 134 (Figs. 4 and 9) and two locking pins 136. Normally the block 128 and its formers 132 will be removed as a unit when a component of different size is to be formed and which calls for a block 128 and formers of different size, although it will be appreciated the same formers 132 may, if desired, simply be shifted onto a spacer block having a different size or adapted to provide a different leg spacing. A flat-headed screw 138 is adjustably threaded into the block 128 and serves as a positioning stop for the body of a presented component having leads to be centralized and then cut and formed for insertion. As indicated in Figs. 4 and 5, prior to and during lead cutting and forming the upper end of the inside former lever 124 is, by means of a tension spring 140 connecting it to the plate 90, yieldingly urged counterclockwise and held in engagement with the flat rear side of the inserting bar 70, the plate 90 being formed with a clearance opening for the lever.

Slidably mounted for vertical reciprocation on the front side of the inserting bar 70 and within the casing 88 is a holder 142 (Figs. 4, 5 and 8) to which screws 144 adjustably secure an outside former unit generally designated 146 and selected to cooperate with a particular inside former unit 122. The outside former unit consists of a spacer block 148 having a pair of vertically grooved outside former legs 150, 150 screwed respectively to its opposite ends. An inserter unit 152 (Fig. 8) is provided with legs arranged to bear on the shoulders of formed leads and accordingly is selected to correspond with the size of component being dealt with, and secured by a screw 154 to the lower end of the inserting bar 70. Initially, and during the lead cutting operation, the outside former holder 142 is caused to descend with the inserting bar 70, a ball detent 156 (Figs. 2 and 8) being nested partly in a bore 158 formed in the holder 142 and partly in a spherical recess 160 formed in the front side of the inserting bar. After the outside former legs 150 have formed the cut leads in staple fashion in cooperation with the inside formers 132, the outside former holder 142 is arrested in its downward movement by engagement of its bottom face with a pair of spaced stops 162, 162 (Figs. 4 and 7) secured to the bottom of the casing 88, the ball detent 156 now being cammed forwardly to occupy the bore 158 and a spherical recess 164 (Figs. 2 and 4) formed in an insert 166 secured to the casing, and thus permitting uninterrupted descent of the inserting bar 70 and the unit 152 to install a formed component. The lower limit of the inserting movement is positively determined by a later-mentioned cross rod 168 (Fig. 19) carried by the link 50 and arranged to abut a stop 170 fixed in the frame 34.

The means by which successive components are presented onto horizontal surfaces of the inside formers 132 and have their leads centralized with respect to their bodies so as to be properly positioned for the subsequent cutting, forming and inserting operations described, will now be explained. It will be understood that any suitable electrical control system may be employed, the one shown in Fig. 27 indicating how the illustrative machine may be connected to said Dorosz et al. conveyor control system as disclosed in its parallel arrangement which is fully described in a copending application, Serial No. 545,765, filed November 8, 1955, in the names of Harold W. Bishop and Basil A. Strout. As herein shown, a solenoid valve S2–A (Figs. 1 and 27) is energized (for example by the control system later explained) to admit air under pressure via a hose 172 (Fig. 1) to the upper end of an air cylinder 174 (Figs. 1 and 2) supported by a bracket 176 projecting from the plate 90. As a consequence, a piston 178 (Fig. 2) in the cylinder is caused to lower its rod 180 and a forked link 182 threaded thereon. This forked link is pivotally connected to a yoke 184 fulcrumed on coaxial pins 186 in the casing 88, the yoke accordingly pivoting clockwise as viewed in Fig. 2 and acting through a pair of spaced, parallel arms 188, 188 (Figs. 2 and 4) to rotate clockwise, as viewed in Fig. 2, a pair of corresponding triangular levers 190, 190 (Figs. 2, 4, 5 and 18) respectively, pivotally connected by pins 191 to the opposite and lower sides of the casing 88. The levers 190 each carry a roller 192 slidably received in a slot 194 formed in a pitman 196 (one only shown in Figs. 2, 4, 5, 17 and 18) depending from each of the pins 186. It will accordingly be noted that the mentioned clockwise movements of the yoke and the levers 190 impart a counterclockwise (as viewed in Fig. 2) movement to the pitmans 196 which is thus effective to cause the carriage feeding or component presenting means mounted on their lower ends and about to be described to be transferred rearwardly and oscillated about a horizontal axis from a receiving position shown in Fig. 4 to a presenting position shown in Fig. 5. The lower ends of the pitmans 196 are coaxially bored to receive pivot pins 198 (Fig. 17), respectively projecting from spaced, angular levers 200, the axes of the pins 198 being in alinement with the longitudinal axis of a component body when supported, as will be explained, and about to have its leads centralized and installed. For effecting oscillation of the levers 200 on the pins 198 simultaneously, each of the levers 200 carries a roll 202 arranged to be received in a cam slot 204 (Figs. 4, 7 and 17) formed in each of parallel cams 206 affixed to the oppositely extending ends of a bottom portion of the cover plate 90.

Accordingly, in presenting a component, the levers 200 pivot clockwise, as viewed in Figs. 2 and 17, about the axes of the pins 198, and similarly swing a pair of parallel support rods 208, 210 which are held clamped in split end portions of the levers 200. For supporting the body of each component to be installed there is adjustably slidable on the rods 208, 210 a pair of arms 212, corresponding ends of which are split to receive the rods and bored to receive clamping screws 214, respectively. The opposite ends of the arms 212 are formed with slots 216 for receiving clamping screws 218, respectively, thus adjustably securing to the arms V-shaped holders 220, 220 which are accordingly adapted to receive a component body with its horizontal axis in predetermined alinement. For preventing displacement of a component body thus received and in the course of its rapid transfer into the head 48 and to be alined in predetermined manner on the now stationary inside former unit 122, a retainer 222 (Figs. 4 and 17) is adjustably mounted in a bore formed on a block 224 clamped on the support rods 208, 210 between the holders 220. It will be understood that the shape of the retainer 222 employed is adapted to the body configuration of the particular component being installed, the retainer shown in Fig. 17 being preferred for use with the rectangular bodies of such components as mica capacitors (Figs. 24 to 26). The block 224 is provided with a latch actuator arm 226 for a purpose later explained. In order further to join and brace the presenting means assemblage being described, a plate 228 (Fig. 17) is secured to the levers 200 and to the block 224 by means of screws 230, respectively, extending between the rods 208, 210.

Figure 6:
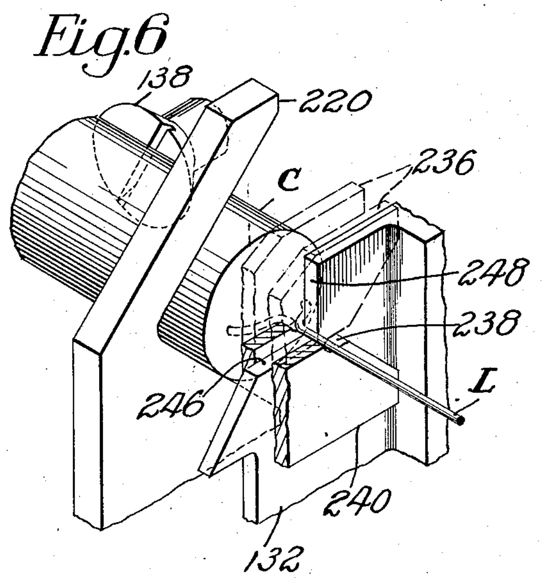
Fig. 6 is a perspective view of lead centralizing parts in operating position.
Figure 8:
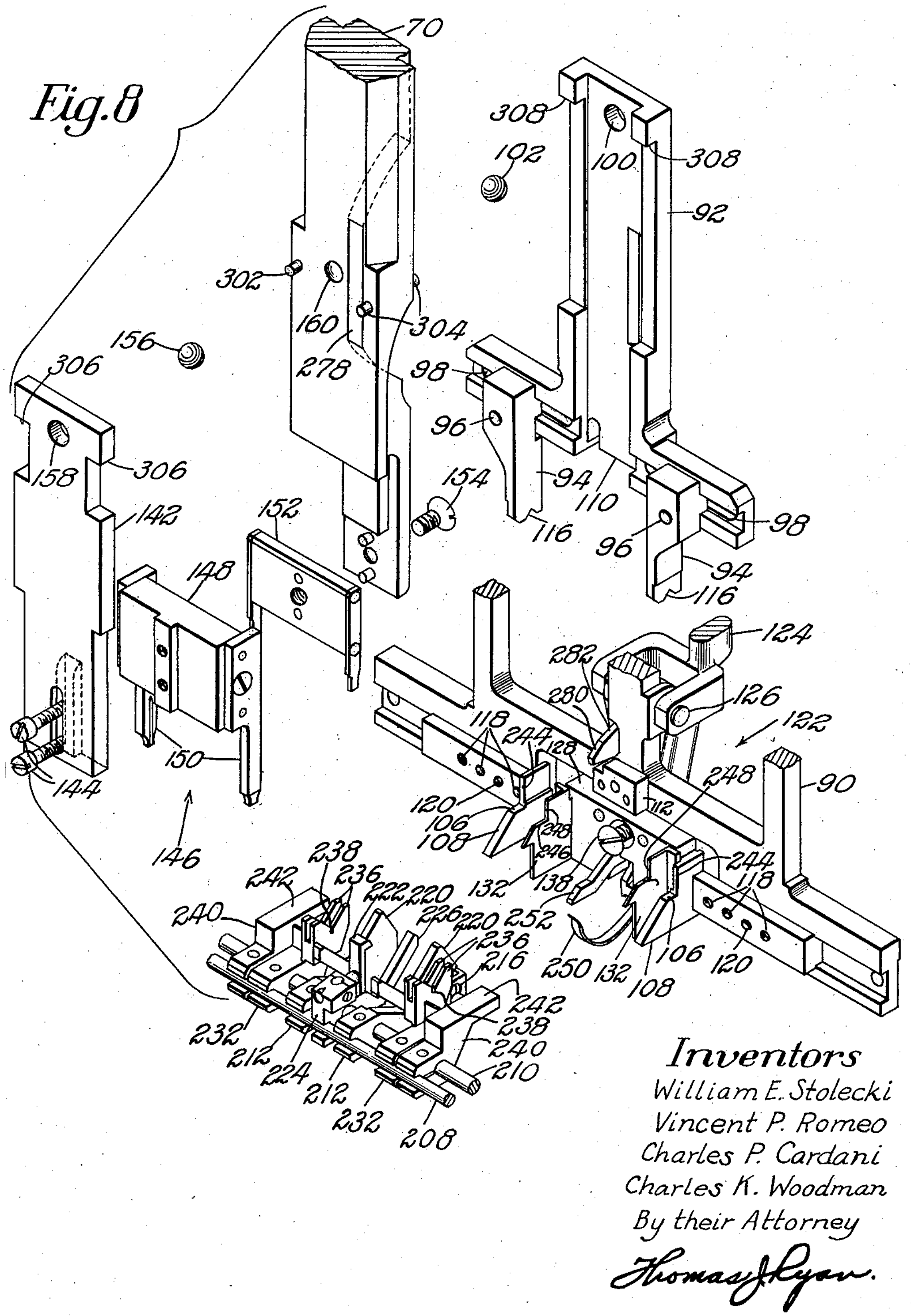
Fig. 8 is an exploded perspective view of the component presenting mechanism and the cooperative lead forming and inserting elements.

The component presenting means is adapted to receive components having either alined or non-alined leads which may be eccentric with respect to their body axes and hence includes lead centralizing mechanism better to insure insertions. Thus, a pair of arms 232, 232 adjustably clamped on the rods 208, 210 is provided, respectively, with a lead engaging centralizer portion 234. The latter consists of spaced V-shaped plates 236 disposed to enable them to straddle, as indicated in Fig. 6, an inside former 132. The bottom of the V-shaped surfaces of each plate 236 preferably merges with, or converges into, a U-shaped lead receiving groove 238 (Fig. 17) formed in each plate, these grooves being alined and preferably arranged to determine the position of a lead in coaxial and concentric relation with its component body. An arm 240 having a flat lead deflecting surface 242 is slidably clamped on the rods 208, 210 between each centralizer arm 232 and its adjacent lever 200, the surfaces 242 acting, if need be, during oscillation of the presenting means to insure that lead portions remote from their component body are straightened or moved more nearly into alinement with the axes of their bodies by being pressed rearwardly on the surfaces 106 and against a flat vertical portion 244 (Fig. 8) of each shear block 108. As most clearly shown in Fig. 6, an eccentrically projecting lead portion more nearly adjacent to an end of a presented component body is centralized preliminarily to the lead cutting and forming operations by being "double bent," i.e., it is first deflected toward the central axis jointly defined by the grooves 238 and the junction formed by right angular surfaces 246, 248 of the respective inside formers 132, and it is then redirected or centralized along that axis. The junctions of the surfaces 246, 248 are disposed to register presented leads with the path of the inserting bar 70. Depending on the nature of the eccentricity of a lead (two extremes are depicted in Fig. 6), in some instances the inside former surfaces 248 perform the initial deflecting, followed by redirecting action as effected by a centralizer plate 236 cooperating with the inside former 132, and in other instances the initial lead deflecting is performed by that centralizer plate 236 closest to the component body, followed by a redirection along the central axis, as determined cooperatively by the inside former 132 in conjunction with both plates 236.

Having presented a component and centralized its leads in the manner explained, the presenting means must be retracted at the appropriate instant for reception of the next component to be installed and to clear the way for operation of the cutting, forming and inserting tools on the component just presented. Provision is accordingly made for retaining the presented component on the inside formers 132 and in body contact with the head of the positioning screw 138 only for the required lead cutting and forming interval, the presenting means being retracted by operation of mechanism hereinafter explained. A body engaging spring finger 250, shown in an inoperative position in Fig. 4, is released therefrom and shifted upwardly into its operating or retaining position shown in Fig. 5 upon downward displacement and unlatching of an arm 252 (Figs. 4, 5, 8 and 9) caused by engagement therewith of the aforementioned actuator arm 226. When in locked or rest position, a shoulder 254 of the arm 252 is yieldingly held in engagement with a lower portion of the inside former spacer block 128, as will be explained. The arm 252 is pivoted at its rearward end on a pin 256 fixed in a roughly L-shaped block 258 (Fig. 9) which is itself pivotally supported on a pin 260 carried by depending forked portions of the inside former lever 124. It is the block 258 to which a rearward portion of the spring finger 250 is adjustably secured by means of a cap screw 262 (Figs. 4 and 5) extending through a clamping block 264, and it is a torsion spring 266 mounted on the pin 256 and having one end abutting the pin 260 which urges the finger 250 toward inoperative position while its other end tends to urge the arm 252 toward latched relation with the block 128. For shifting the spring finger 250 into operating position when the arm 252 is unlatched, a loaded "mouse trap" torsion spring 268 mounted on the pin 260 and having its ends inserted in vertical bores in the inside former lever 124 bears, by means of its U-shaped mid portion, on the rearward end of the block 264 to pivot the latter and thus swing the finger 250 clockwise (as viewed in Figs. 4, 5 and 9) about the pin 260 and into yielding engagement with the component body as shown in Fig. 5.

Retraction of the component presenting means from the component retained by the finger 250 is now effected by further operation of electrical control mechanism previously mentioned only in part. Preliminary to explaining this mechanism, and by way of briefly reviewing the parallel conveyor control circuit disclosed in said Bishop et al. application (reference numerals in Fig. 27 corresponding for convenience to those shown in Figs. 21 and 22 of said application), a system starting switch 364 is closed to energize a coil 366 and close contacts 368, 370, closure of the latter energizing a motor M for driving the conveyor. The conveyor and insertion control circuits are activated by closing a line switch 372, a coil 374 being energized through a normally closed contact 376 of a clamp initiating switch to open a contact 380. This switch is adapted to be actuated by arrival and clamping of a pallet (not herein shown) carrying the board 30 into component receiving position. When all pallets on the conveyor have arrived at their respective stations, the contact 376 (and corresponding contacts of other stations) is opened and a contact 382 is closed. This de-energizes the coil 374 and causes the contact 380 to close. A coil 386 becomes energized through the contacts 382 and 380 and consequently contacts 388, 390, and 392 are closed. Closing of the contact 390 energizes a clamping solenoid valve 396 which operates means not herein shown for holding the board carrying pallets in their fixed component receiving positions. The clamping of the pallets and resulting closure of an inserter initiating switch 398 on the conveyor energize the machine driver solenoid valve S3 (designated 122 in said Bishop et al. application) through a circuit which includes a set-up clamping switch 400, a pair of normally closed contacts 402, 406, a contact 404 of a two-position switch, and a normally open contact K13–B. The latter became closed upon energization of a coil K13 through a normally open, held-closed contact M4 (Figs. 2 and 27), said coil K13 also acting to open a normally closed contact K13–A for a purpose later explained. With the valve S3 thus energized the motor 38 is effective to cause the inserting bar 70 to descend to install a component in the cycle of the head 48.

On the start of the inserting stroke, a control switch M1 (Figs. 1 and 27) closes to energize a coil K14 thus closing normally open contacts K14–A, K14–B and K14–D, and opening normally closed contact K14–C. The closing of contact K14–A energizes relay coil K15, closing normally open contact K15–A, locking in coil K15, and making power available to the contact K14–C which is now open. The closing of the contact K14–B illuminates pilot light PL to indicate that the bar 70 has descended from its starting position, the light thus showing that if the bar fails to return to starting position, that particular bar 70 is preventing operation of the conveyor. The closing of the contact K14–D holds the coil 386 energized to maintain the pallet in clamped position until insertion has been completed. When the contact 406 is thereafter opened as a result of the de-energizing of a coil K2 in the conveyor timing circuit, the driver solenoid S3 is de-energized thus permitting the spring 46 to return the bar 70 upwardly to starting position.

At the full return of the bar 70, the switch M1 opens, de-energizing the coil K14, opening the contacts K14–A, K14–B, K14–D, and closing the contact K14–C. Power is now available at the feed solenoid valve S2–A (Figs. 1 and 27) and, in the course of the descent of the piston 178 to present a component for forming, a normally open, held-closed switch M4 (Figs. 2 and 27) opens to de-energize a relay coil K13, thus closing a contact K13–A and opening a contact K13–B. The machine driver solenoid S3 is inoperative until the presenting and feed return cycle is completed. The switch M4 is operated by a contact 270 (Fig. 2) adjustably fixed on a rod 272. The latter is slidably mounted in a housing 274 (Figs. 1 and 2) mounting the switch M4 and secured to the air cylinder 174. For moving the contact 270 and the rod 272 heightwise in accordance with corresponding movement of the piston 178, a link 276 connects the rod to the link 182. At the end of the downstroke of the piston 178 a switch M3 (Figs. 2 and 27) is closed by the contact 270 to energize a relay coil K12, open a normally closed contact K12–A, and close normally open contacts K12–B, K12–C, and K12–D. The opening of the contact K12–A de-energizes the solenoid valve S2–A; the closing of the contact K12–C maintains the coil K12 energized; and the closing of the contact K12–B energizes a feed return solenoid valve S2–B (Figs. 2 and 27), thus admitting air under pressure into the lower end of the cylinder 174 and causing retraction of the presenting means to component receiving position. During such retraction the switch M3 is opened and switch F4 is closed in preparation for the next feeding cycle.

From the foregoing it will be clear that after a component presenting and feed return cycle has been completed in the manner described, upon reclosure of the switch M4 to energize the coil K13, open the contact K13–A and close the contact K13–B, the machine driver solenoid S3 becomes operative to initiate a new cycle of the head 48, its cycles thus alternating with those of the presenting means to effect installation of successive components. As a consequence of opening the contact K13–A, a hereinafter mentioned solenoid S1 (Figs. 7, 18 and 27) pertaining to tape stripping means later to be described is energized.

At the instant in a cycle when lead cutting and forming have been completed in the manner above described, in order to clear the way for an inserting stroke of the inserting bar 70 the upper end of the inside former lever 124 is caused by the spring 140 to be swung counterclockwise (as viewed in Fig. 5) into a slot 278 formed in the bar 70. Also, mechanism is actuated by the inserting bar 70 for restoring the spring finger 250 from its position indicated in Fig. 5 to its lowest and inoperative position (not shown). For this purpose, as well as to reload the spring 268 and reset the arm 252 in its locking position, a rounded lower end of the descending bar 70 engages a nose 280 (Figs. 8 and 9) formed on an actuating lever 282. This lever is carried by a depending resetting lever 284 (Fig. 9) as will now be explained, the lever 284 being pivotally suspended from the pin 126. For securing the actuating lever 282 (Fig. 9) to the lever 284, a bushing 286 nested in the lever 282 is provided with a squared end slidably received in a slot 288 formed in the lever 284, the bushing being threaded to receive a cap screw 290. An upper slot 292 in the lever 284 is formed to receive a stop block 294 secured to the lever 282 by a cap screw 296. The block is slightly smaller in heightwise dimension to permit a limited relative pivotal movement between the levers 282, 284 which insures, during subsequent upward retractive movement of the inserting bar 70, avoidance of binding action with the nose 280. The lower end of the lever 284 is provided with a vertical slot 298 through which extends a pin 300 that also extends through a bore formed in the block 264. Accordingly, in the course of the inserting stroke, by reason of the counterclockwise movement (as seen in Fig. 5) imparted to the lever 284 through the lever 282 and relatively to the counterclockwise moving inside former lever 124, the pin 300 is effective to cause the block 264 to pivot counterclockwise about the axis of the pin 260, the spring 268 thus being reloaded and the arm 252 relatched. It will be understood that after completing its downstroke to install a component with its centralized leads inserted as shown at *c* in Fig. 13 (prior condition of the leads being diagrammatically indicated at *a* and *b* for comparison), a pair of pickup pins 302, 304 (Fig. 8) doweled in the bar 70, have projecting ends arranged, in the course of its return or upstroke, to engage shoulders 306, 308 (Fig. 8) respectively formed in the outside former holder 142 and the knife holder 92, the latter thus being lifted to their initial heightwise positions and all parts of the head 48 being restored to their starting condition.

As has been indicated, the illustrated machine may be operated as a single unit with or without being mounted at a conveyorized station, and in such instances successive components to be installed may be individually hand fed to the presenting means described, or the machine may be adapted, as will next be explained, to deal automatically with body belted components, this latter feeding system ordinarily being preferred when numerous components of one size are to be inserted. When components are "body belted," a single tape T (Figs. 2, 4, 5 and 18) extends transversely of their bodies to bind them in a row and facilitate their storage and consecutive feeding as from a reel 310 (Fig. 1) rotatably supported on an upper end of a bracket 312 (Figs. 1 and 2). This bracket is secured on the head casing 88. As shown in Figs. 2 and 10 the belted row of components is unwound from the reel and extends downwardly through a vertical raceway generally designated 314 (Figs. 2, 10 and 15). This raceway is preferably comprised of a pair of tracks 316, 316 (Figs. 2, and 10 to 12) which is adjustably mounted in parallel, spaced relation to a pair of tracks 318, 318 cooperatively to provide a suitable vertical guideway for the component bodies as they are about to be fed to the presenting means by mechanism later to be described. As shown in Figs. 10 to 12, the cross sections of the adjacent tracks 316, 318 are roughly H-shaped and substantially alike, each having a thin land 320 and a thicker and shorter land 322.

Accordingly, each guide rail has two body engaging surfaces which are offset by different distances from a lead engaging surface. When the four thin lands 320 are arranged in body contacting relation (Fig. 10), components of larger diameter or thickness may be accommodated than when the four thick lands 322 are in body contacting relation such as illustrated in Fig. 11. Moreover, as noted by comparing Figs. 11 and 12, reversing only the positions of tracks 316, 316 to bring their thin lands 320 together provides a nearly completely enclosed guideway for component bodies of shorter length yet it insures adequate clearance for feeding of the tape T. In their selected relative arrangements, the respective tracks 316, 318 are adjustable to selected positions to accommodate a large range of different lengths and shapes of bodies, whether taped or not, the tracks 316 only being movable relative to the tracks 318 for adapting to different body thicknesses. For this purpose corresponding ends of four studs 324 (Figs. 4 and 14 to 16) rectangularly disposed in the bracket 312 extend through U-shaped slots therein and are clamped to the bracket by wing nuts 326. The other ends of the studs receive screws 328, respectively, to secure thereto parallel, horizontally slotted crossbars 330, 332 and vertical bars 334, 336. Wing nuts 38 (Figs. 15 and 16) extend through the slots of the bars 330, 332, respectively, and are threaded into the tracks 318 to clamp them in selected spacing dictated by the length of the bodies to be fed. Gage markings 340 on the respective bars 330, 332 facilitate quick adjustment of the tracks 318 in parallel for standard body lengths. For adjustably supporting the tracks 316, a pair of laterally spaced vertical bars 342, 342 (Figs. 14 and 16) are slidably mounted on pairs of the studs 324 and held in appropriate positions thereon by wing screws 344. Bridging the upper and lower ends respectively of the bars 342 are horizontal tie bars 346 (Figs. 14 and 16) along which a pair of spaced, rabbeted slides 348 is movable, each slide being fixed in selected position lengthwise of components by a set-screw 350. Each side 348 receives in its rabbeted portion a track 316 slidably adjustable vertically as determined by a shoulder screw 352 extending through a slot in the slide and threaded into one of two bores in the track. The lower or delivery ends of the tracks 316 are held in adjustably selected heightwise positions for clearing different body thicknesses by means of set-screws 354 threaded into the slides and engaging the tracks endwise.

Adjustable heightwise of the delivery end of the raceway and secured to the crossbar 330 is an L-shaped arm 356 (Figs. 14 and 15) which has screwed to one end a stripper finger 358 (Figs. 4, 10 and 15). This finger has somewhat tapered end portions of different width, either one of which may be arranged to be engaged progressively by the tape T of corresponding width as it is stripped from successive components and drawn angularly from its plane in the raceway and around a pair of spaced idler rolls 360, 362. These rolls are rotatably mounted on shafts journaled in a frame 410 (Figs. 4, 7 and 18) supporting tape stripping means about to be explained, said frame 410 being secured to the lower end of the casing 88 and extending adjacent to the lower ends of the tracks 316, 318 and above the described components presenting means. For controlling the escapement of successive endmost components to be installed, an offset guideway on the lower end of the tracks 316, 318 is defined by angular pieces 412, 412 (Figs. 4 and 10) affixed to the tracks 316, respectively, and similar angular pieces 414, 414 affixed to the tracks 318, respectively. As shown in Fig. 4, a stripped component, when ejected by means shortly to be described into the offset portion of the raceway, is guided for deposit into the V-shaped holders 220, 220. A rod 416 (Figs. 14 to 16) secured to the lower tie bar 346 is provided at its lower end with a depending, flexible strip 418, preferably of leather, for insuring that the ejected component is not deflected from its path of delivery into the holders 220.

For drawing the tape T around the rolls 360, 362 to strip and to attempt to feed the components consecutively at a rate faster than the rate of insertion effected by the head 48, a winding reel 420 (Figs. 2, 4, 7 and 18) is driven by feed mechanism having operating connection to the means described for actuating the component presenting means. Thus, as shown in Fig. 18, one of the triangular levers 190 has secured thereto an arm 422 which is pivotally connected to one end of a lever 424. The other end of the latter has pivotal connection with an upper end of a crank lever 426 pinned at its lower end to one end of a main operating shaft 428 journaled in the frame 410 (as viewed in Fig. 18 it is the remote end of the shaft 428 upon which the roller 362 is mounted). In turning the crank lever 426 clockwise (as seen in Fig. 18) about the axis of the shaft 428, a stub shaft 430 extending through the lever and parallel to the shaft 428 swings a pawl 432 (Figs. 5, 7 and 18) fixed on the stub shaft to rotate a ratchet wheel 434 clockwise. The latter is rotatably mounted on the shaft 428 and is integral with a spur gear 436 which is in mesh with an intermediate gear 438 supported by a shaft journaled in the frame 410. Accordingly, a gear 440 keyed on a shaft 442 having bearings in the frame 410 and driven by the gear 438 is effective to rotate the shaft 442 and a drive pin 444 (Fig. 18) fitted transversely therein. The winding reel 420 is formed with a coupling slot 446 adapted to receive the pin 444 when the reel is retained in operating position by means of a small lever 448 (Fig. 7) pivotally supported in the forked end of the shaft 442. The arrangement is such that alining the lever 448 axially with the shaft 442 permits mounting and demounting of the reel 420.

From the foregoing it will be apparent that the tape T and the taped components are caused to be advanced in the raceway by the clockwise rotation (as viewed in Fig. 18) of the reel 420, thus displacing downwardly the several stripped components and bringing a downward pressure to bear upon the full reservoir of stripped components such that the endmost component in the straight portion of the raceway is forced downwardly on a pair of parallel, supporting feeler fingers 450 (Figs. 4, 5, 10 and 18). As a consequence these fingers are depressed to actuate electrically operated means about to be described for effectively discontinuing the tape stripping operation, thus insuring that a plurality of components will invariably become available (regardless of gaps occurring by chance between components on the tape, as illustrated in Figs. 4 and 5) for successive delivery to the presenting means and that thereafter no further tension will be exerted which might strip the tape from more components than required. The fingers 450 are each made fast on a pivot pin 452 (Figs. 10 and 18) having bearings in the frame 410. When the fingers 450 are pivoted, linkage including an L-shaped lever 451 pinned at one end on the pivot pin 452, is thus actuated, a link 453 pivotally connected by an elongated pin 454 to the other end of the lever 451 causing a lever 455 to be pivoted on a pin 456 (Fig. 18) rotatable in the frame 410. An arm 457 of the lever 455 is accordingly swung counterclockwise, as viewed in Fig. 18, and against the resistance of a tension spring 459 connecting the lever and the frame 410. As a result, an upper end portion 458 of the lever 455 permits a roll carrying leaf spring 460 (Figs. 4, 5 and 18) to move to close a normally open control switch M2 (Figs. 4, 5 and 27) in the circuit which includes the contacts K12–D and K13–A for energizing the rotary solenoid S1. The solenoid S1 is secured by its studs 462, 462 (Fig. 18) to a U-shaped block portion 464 formed integral with the crank lever 426 and is provided with a spindle 466 which, when the solenoid S1 is energized, is rotated counterclockwise as viewed in Fig. 18 about an axis alined with that of the shaft 428. Such rotation of the spindle is against the resistance of a return clock spring 468. Pinned to the spindle is a block 470 carrying at its upper end a pin 472 which is received in the forked lower end of a block 474 pinned to the stub shaft 430. The counterclockwise rotation of the solenoid spindle and corresponding rotation of the block 470 is thus effective reversely to rotate the block 474 and the shaft 430, hence disengaging the pawl 432 from driving relation and terminating tape feed at the proper instant.

For laterally shifting the lowermost component on the depressed fingers 450 to eject it toward the presenting means, a pair of L-shaped pusher fingers 476, 478 (Figs. 4, 5, 10, 18 and 24) is mounted in a movable carriage generally designated 480. This carriage includes a slide 482 (Fig. 18) slotted to ride toward and from the raceway upon a pair of rails 484, 484 secured by screws 486 (Fig. 5), respectively, to the frame 410. Adjustably connected to the slide 482 by clamping screws 488 extending through horizontal slots in the slide is a carrier block 490 that is bored to receive a clamping screw 492 extending through a heightwise slot in the finger 478 and threaded into the finger 476. Accordingly, the finger 478 may be adjusted heightwise of the finger 476, as desired, for different component body sizes. Ejecting movement of the pusher fingers is initiated by a torsion spring 494 mounted upon a sleeve portion 496 of a forked lever 498 arranged to operate the carriage 480. For this purpose the shaft 428 extends through the sleeve portion 496, and one end of the spring 494 is anchored on a pin 500 in the frame 410, the other end of the spring bearing against the mid portion of the lever 498. The initial clockwise movement, as viewed in Fig. 18, of the lever 498 acts to shift the carriage by means of a pin 502 extending through bifurcated lower ends of the lever and through the slide 482, the carriage movement continuing until the pin 502 abuts an end of a slide release latch 504 pinned to an end of a shaft 506 rotatable in the frame 410. Incidentally, it is a detent 507 freely mounted on the shaft 506 and backed by a leaf spring 509 secured to the frame 410 which acts to hold the ratchet wheel 434 against rotation when the pawl 432 is disengaged. Additional clockwise movement of the lever 498 is effected by the spring 494 to complete the ejecting stroke when a pin 508 (Fig. 18) in the shaft 428 is rotated away from a cut-away portion 510 of the sleeve 496, the pin 508 being thus moved by the operation of the lever 190 in now rotating the crank lever 426 and the shaft 428 clockwise, as viewed in Fig. 18. In so moving clockwise, the lower end of the lever 426 engages a setscrew 512 threaded through an arm 514 pinned on an end of the shaft 506, and accordingly, the latter is rotated counterclockwise to raise the latch 504, the pin 502 then being cleared to permit the fingers 476, 478 to move to eject the component until the slide 482 engages the frame 410. To insure that each ejected component will be thrust downwardly from the delivery end of the raceway, a pair of spring fingers 516, 517 (Fig. 10) is secured to each of the pieces 412. Subsequent counterclockwise movement of the crank lever 426, as viewed in Fig. 18, rotates the pin 508 and hence the lever 498 to retract the fingers 476, 478 and thus allows the next component to be advanced into position on the fingers 450 for ejection.

Provision is made to insure depression of the feeler fingers 450 even though one or more components is "missing" from the tape, i.e., is spaced on the tape immediately above the stripper finger 358 by more than the thickness of a component body from an adjacent component. For this purpose a cam 518 (Figs. 4, 5 and 18) is screwed to the block 490 and has a surface 520 (Fig. 5) disposed to engage the pin 454 in the course of the feeding movement of the carriage 480. This engagement causes depression of the feeler fingers so that the lowermost component in the reservoir of stripped components will be lowered sufficiently to be ejectable into the offset portion of the raceway. It will be understood that the arrangement just described is not needed when smaller components are to be inserted. In order to provide adequate tension such that mere weight of the stripped reservoir of components cannot depress the feeler fingers prematurely, the spring 459 may have its effective resistance adjusted.

Under most, if not all, operating conditions the component feeding means as just described is entirely satisfactory and affords the sensitive control which is required. As an optional precautionary measure in guarding against over-feeding of the tape, for example when the time of reaction of a particular solenoid S1 is slow in effectively disengaging the pawl 432 to stop tape feed, a self-locking device may be employed. This device consists in a wedge-shaped arm 522 (Figs. 4 and 5) fast on the pin 456, a lower end of the arm 522 thus being disposed to be swung into clampig engagement with a portion of the tape T yieldingly backed by a strip of material 524, preferably of Teflon. This strip is secured across the top of a block 526 secured to the frame 410 and provided with a recess in which a spring-backed plunger 528 is arranged to urge the strip toward clamping engagement with the tape. It will be noted that the sleeve-locking device is shown in its inoperative condition in Fig. 5, and in operative condition in Fig. 4.

After adjustments to adapt for each partcular size and shape of component body it is found that little or no change in arrangement or construction of the machine is needed to enable a large variety of components to be installed with rapidity. As illustrated in Figs. 24 and 26, for instance, Mica-mold capacitors having rectangular shaped bodies 530 may be fed and installed successively. In this case a minor modification found helpful is an addition to each of the arms 212 of a somewhat L-shaped leaf spring 532 in lieu of the V holders 220, 220. It is also desirable to position the upper pusher finger as shown and to adjust the stop screw 138 outwardly. Any suitable form of lead clinching mechanism may be bolted in the base of the main frame 34. The mechanism 36 (Figs. 19–23) is operatively connected to the air motor 38 and its control system, as will be explained, to clinch the leads of a component when it has been installed by the inserter bar 70, and usually while the latter is engaging the board 30 as a holddown, as indicated in Fig. 23. Depending from each end of the cross rod 168 (Fig. 19) is a link 536 having having pin-and-slot connection with a lever 538 pivoted at 540 to the frame 34. The lever 538 also has a pin-and-slot connection with one end of an actuating link 542, the other end of which is pivotally connected to the knee of toggle levers 544, 546. The upper end of the lever 544 is pivotally connected to an anvil carrier 548 movable heightwise in and having dovetail relation to a bearing bracket 550 fixed in the machine base. A return spring 551 (Fig. 19) connecting the link 542 and the bracket 550, acts to urge the toggle 544, 546 into broken condition. For adjustably determining the limits of heightwise movement of the carrier 548 the lower end of the lever 546 is pivotally supported by a lever 552 fulcrumed at one end on the bracket 550 and having its other end adjustable heightwise by means of a screw 554 threaded therethrough and engageable endwise with the frame 34. Secured to the upper end of the carrier is a cylinder 556 (Fig. 21) housing a vertically movable piston 558 therein. This piston may be pneumatically forced upward against the resistance of a return spring 560 recessed in a cap 562 on the cylinder 556 and mounted on a center pin 564 anchored in the carrier. Heightwise movement of the piston 558 correspondingly moves a pair of anvil actuating pins 566, 566 slidable, respectively, in bushings 568, 568 rotatably extending in bores formed in the cap 562. The bushings are respectively formed with a clamping collar 570 and a forked board-engaging end in which a wiping anvil 572 is pivotally mounted on a horizontal pin 574. A return spring 576, mounted on a pin 578 in each forked bushing end, has one end anchored in the bushing and its other end bearing on a wall of a slot 580 formed in the anvil, thus to urge the latter to assume a non-operating position wholly within the bushing, as shown in Fig. 21. As seen in Fig. 23, in the course of pivoting the anvils by reason of the upward movement of the pins 566, end portions of the anvils engage the projecting lead ends, respectively, to bend and wipe them against the wiring board 30. A clamping bar 584, having its ends slotted, respectively, to receive the bushings 568 while bearing on the collars 570, is bored to receive a cap screw 586 which is threaded into the center pin 564, the single screw 586 thus securing the bushings to the cap 562 and this cap in selected position about a vertical axis to the cylinder 556. Thus, directional clinching of leads, according to the independent positioning of the bushings, may be had, and, by means of a stop screw 588 (Figs. 19 and 22) in the cap and engageable with the piston 558, the upper limit of wiping movement of the anvils may be accurately adjusted to provide a flat clinch (shown in Fig. 23) or an angular one, such that lead ends, after clinching, are inclined to the board in the desired degree.

When the solenoid S3 has been energized to introduce air under pressure via the pipe 42 to the motor 38 to lower the inserter bar 70 and thus to install a component, the linkage including the lever 538, the link 542, and the toggle 544, 546, is operative to raise the carrier 548 until the bushings 568 abut the board 30 opposite to the engagements of the bar 70 therewith, as shown in Fig. 23. Thereupon, a build-up of air pressure in the pipe 42 ensues which is effective to displace upwardly a spring-backed plunger 590 (Fig. 20) slidably mounted in a valve 592 (Figs. 1 and 20). A stop screw 594, threaded into the valve, is adjustable to control the build-up of pressure until it is adequate to force air to be vented through a port 596 in the plunger, said port then being in communication with a passageway 598 in the valve and with one end of a hose 600. The other end of the hose 600 (Figs. 19 and 22) is connected to a port in the bracket 550 having communication with a passageway 602 formed in the carrier 548. The upper end of the passageway 602 extends into the cylinder 556 and the lower end of this passageway is shiftable from a vent 604 formed in the bracket 550 into operative communication with the hose 600. Accordingly, the lead wiping action is effected when the anvil fingers have been raised and are pivoted against the leads, the inserting bar then bracing the wiring board 30 against upward yield.

A cycle of the machine will now be reviewed, it being assumed that the machine head 48 has been correctly oriented and positioned, that the spacing of the raceway 314, the presenting means, and the shear blocks has been properly adjusted, and that appropriate inside and outside formers have been mounted for the particular components to be installed. A leading portion of bare tape extending around the idler rolls 360, 362, and integral with or spliced to the component carrying tape T in the raceway, will initially be wound taut on the roll 420, the latter being rotated in the direction indicated by arrow in Fig. 4, and preferably until a reservoir of several stripped components fills the raceway between the stripper finger 358 and the feeler fingers 450. At the start of a normal conveyorized cycle of the machine, as indicated in Figs. 1 and 2, the inserter bar 70 is fully retracted upward and one component is retained on the inside formers 132 by the finger 250 in position to be cut, formed, and inserted, while the next component to be inserted has previously been stripped from the tape T and rests on the feeler fingers preparatory to being ejected for deposit into the retracted V-holders 220, 220 or their equivalent. The machine cycle is initiated upon closure of the conveyor switch 390 by pallet clamping, as described, to energize the driver solenoid valve S3, the motor 38 consequently causing the inserter bar 70 continuously to descend to its inserting position (Fig. 23) and causing the leads of the component to be severed and formed in staple fashion in the course of its descent. The control switch M–1 (Figs. 1 and 27) closes at the start of the inserting stroke to actuate contacts which insure holding of the board 30 in component receiving position and which cause the pilot light PL to be lit. When the toggle 544, 546 has been straightened by the last portion of the operating stroke of the motor 38, thus to cause the anvil bushings 568 to engage the board 30 adjacent to the projecting lead ends, sufficient build-up in air pressure is permitted to actuate the valve plunger 590 and to move the piston 558 upwardly whereby the anvils 572 are pivoted by the pins 566 to bend and clinch the projecting leads against the board 30 and in the desired direction. As soon as the coil K2 is deenergized by the conveyor timing circuit to open the contact 406, the solenoid S3 is deenergized and hence the spring 46 is permitted to restore the operating parts in the head 48 and the anvil mechanism 36 to their inoperative starting positions.

Alternating in operation in a machine cycle with the lead cutting, forming, inserting, and clinching mechanism described is the operation of the means for presenting components thereto and centralizing their leads, plus concurrently acting tape feeding mechanism, to insure that said presenting means is kept well supplied with components to be installed. Accordingly, when the deenergized solenoid S3 has permitted full retraction of the inserting bar 70 and re-opening of the switch M–1, power is available at the feed solenoid valve S2–A and the piston 178 descends to cause pivoting of the triangular levers 190 (clockwise as seen in Fig. 2). As a result, the V holders 220 and the pairs of lead centralizer portions 234 are moved in translation and clockwise oscillation to present a component on the inside formers 132, as shown in Fig. 6, the inside former unit 122 then being in its fixed component supporting position shown in Fig. 5. If, as is commonly the case, one or both leads of the component were not previously in alinement with a predetermined axis (normally one passing through their component body), the cooperation of the inside formers 132 and the portions 234 will make them so, this lead centralizing insuring that, after the leads have later been cut and formed as above described, their ends can, and will, be directed into the preformed holes of the wiring board 30 by the inserting bar 70. The spring finger 250 is raised into position (Fig. 5) to retain the presented component body in engagement with the screw 138 as a result of the operation of the arm 226 of the presenting means. The feed switch M4 had opened as the component was being presented and the feed switch M3 is closed as the piston 178 reaches the bottom of its presenting stroke. Consequently the solenoid valve S2–A is then deenergized and the solenoid valve S2–B is energized to effect counterclockwise movement (as viewed in Fig. 2) of the levers 190 and retraction of the unloaded presenting means from the machine head. In the course of the counterclockwise movement of the levers 190 (as viewed in Fig. 2, clockwise as viewed in Fig. 18) to retract the presenting means, the linkage 422, 424, 426 (Fig. 18) is operating by means of the pawl 432 and the gearing 436, 438, 440 to rotate the roll 420 and thus advance and strip the taped components in the raceway. The mechanical arrangement is such that a positive effort is made to feed more components into the lower end of the raceway than is necessary to meet the usual needs of the presenting means, a resorvoir of stripped components (which may vary in number) thus being replenished and always being available to compensate for the occasional instances when, because of possible gaps or irregular spacing between components as mounted on the tape T, the full operating stroke of the linkage 422, 424, etc., may be unable immediately to replace a component which is being installed. In other words, the roll 420 is always urged to advance the taped components along the raceway by more than the dimension of a component as measured in the direction of the feeding. The switch M2 controlling energization of the solenoid S1, which acts to terminate tape feeding, can only be closed when the reservoir of stripped components in the raceway below the stripper finger 358 is full. Thus, tape feeding, regardless of the size of the roll 420 with its accumulated tape, continues until sufficient pressure has been exerted through the reservoir of stripped components to depress the feeler fingers 450 and actuate the connecting linkage which closes the switch M2 to energize the solenoid S1. Hence the feeding mechanism is, in effect, of a self-adjusting variable pitch type and capable of dealing with different sizes of components and regardless of their irregularity in spacing on a tape. At ascent of the piston 178 causing the retraction of the presenting means, the feed switch M3 is opened and the switch M4 is closed near the end of the piston ascent to deenergize the solenoid S1 and permit its spring 468 to return the pawl 432 to engaged relation with the ratchet wheel 434. After tape feeding has been concluded in a cycle (considerably longer if the solenoid S1 had been earlier energized through the operation of the switch M2), and when the holders 220 have been retracted nearly to their component receiving position, the ejecting means for delivering the component on the fingers 450 is actuated. Preparation for the ejection commences during the initial clockwise movement of the lever 426 and the shaft 428 (as viewed in Fig. 18) and the retraction of the presenting means because it is then that the pin 508 moves away from the sleeve portion 510 to permit the spring 494 to move the carriage 480 part way toward the head until the pin 502 engages the end of the release latch 504. Effective ejecting movement of the pusher fingers 476, 478 by the spring 494 and the lever 498 is thereafter triggered at the proper instant by engagement of the clockwise moving lever 426 (as viewed in Fig. 18) with the setscrew 512 consequently to rotate the shaft 506 counterclockwise and thus unlatch the pin 502 from the latch 504. The cycle is now completed and the circuit to the driver solenoid valve S3 is closed in readiness for another inserting signal from the conveyor.

Having thus described our invention, what we claim as new and desire to secure by Letters Patent of the United States is:

1. In a machine for forming and inserting axial leads of components into work pieces, a frame for supporting a machine head with respect to the work piece, means movably mounted in said head for forming the leads with selected leg spacing and inserting them into the work piece, said means including a reciprocable inserter and cooperative inside and outside formers controlled thereby, and means movably mounted on said inside former for urging each component to be inserted to be positioned transversely of the path of said inserter and held against spaced locating surfaces of the inside former preceding the cooperation of the outside formers therewith.

2. A machine for mounting axial lead components in work pieces comprising a machine head, an inserter mounted therein for movement toward and from a work piece, lead forming mechanism in said head including means movable into the path of the inserter to receive and support successive components adjacent to their bodies and by their respective leads, feeding means mounted exteriorly of said head and movable to present each component horizontally disposed on said supporting means, when the latter is in the path of the inserter, and then to retract therefrom, a member connected to said lead forming mechanism and arranged to be moved from an out of the way position forcibly to engage the body of each presented component to clamp it against an adjustable abutment and locate its leads on said supporting means in position for forming after retraction of said feeding means, and means for operating said feeding, forming and inserting means in sequence.

3. A machine as set forth in claim 2, and further characterized in that said lead forming mechanism includes cooperative inside and outside formers, said component retaining member consists of a yieldable finger swingably mounted on the inside former for movement into and out of engagement with a presented component, and means is provided whereby said finger is alternately shifted into and out of operating position by the feeding means and the inserter.

4. In a machine for mounting axial lead components on work pieces and having a reciprocable inserter and lead bending means including a pivotal inside former, a gage mounted on the inside former to register the body of a component to be inserted with respect to the operating path of the inserter, a finger movably mounted on the inside former yieldably to urge the component body against said gage when the inserter is retracted from the work piece, and means controlled by the advance of said inserter for clearing said finger from its operating path after the leads have been bent.

5. In combination with a machine head having means for forming and inserting axial lead components in work pieces, reciprocable feed mechanism mounted on said head for presenting successive components into position to be operated upon by said means, said mechanism including axially alined lead and component body holders adapted in one position to receive each horizontally disposed component and movable in translation and about a horizontal axis to present it, a member movably mounted in the head to retain and position the presented component with respect to the forming and inserting means, and power means for operating said feeding mechanism alternately with said forming and inserting means.

6. A machine for mounting axial lead components comprising a head having lead forming means and an inserter cooperative therewith, said forming means including spaced lead engaging surfaces disposed respectively to position and aline the leads of a component with an axis extending through its body, and means movably mounted on said head to transfer successive components from a receiving position and present them to said forming means, said presenting means including an oscillatory V-shaped holder for each lead arranged to cooperate with said lead engaging surfaces respectively to effect alinement of the leads with said axis.

7. In a machine for mounting axial lead components, a head, a former mounted therein for movement to and from a lead bending position and provided with adjustably spaced lead supporting surfaces to accommodate components within a range of body lengths, a stop adjustably mounted in said former and arranged to engage the body of each component within a range of thicknesses to position its leads when alined on said surfaces, means including axially spaced, V-shaped holders movably mounted on said head to receive and present successive components onto said surfaces and against said stop, and power means for operating said presenting means and former in sequence.

8. In a machine for mounting axial lead components, a head including a vertically reciprocable inserter and relatively movable means for bending the leads of successive components to be mounted by said inserter, and mechanism mounted adjacent to said head for presenting successive components to said bending means and into the path of the inserter, said mechanism comprising component holding means engageable with the body and leads of each component and movable in translation and about a horizontal axis, the lead bending means including a pair of axially adjustable inside formers provided respectively with angular lead engaging surfaces, and the presenting mechanism including a pair of correspondingly adjustable V-shaped members provided with lead receiving grooves and adapted to cooperate with said angular lead engaging surfaces to position the leads prior to forming.

9. In a machine for mounting axial lead components, a head including a vertically reciprocable inserter and an inside former movable into and out of lead forming position, said inside former having axially spaced lead supporting surfaces arranged to engage transversely the respective leads of successive components presented into said head, and means for thus presenting the components successively when said inside former is in lead forming position, said means including axially spaced V-shaped body holders and lead holders, the latter being disposed in pairs arranged to straddle the respective lead supporting surfaces of said inside former.

10. A machine for mounting axial lead components comprising a head having a reciprocable inserter therein, lead forming means mounted in said head including axially spaced inside formers movable into and out of the path of said inserter, and means mounted on said head for presenting the bodies of successive components between the formers and with the leads to be formed on said inside formers, said presenting means including lead clamping mechanism arranged to cooperate with said inside formers to centralize at least the portion of each of the leads thereon with respect to an axis extending through its body prior to their being formed.

11. A machine as set forth in claim 10 and further characterized in that said centralizing mechanism consists of two pairs of parallel V-shaped members arranged to engage the respective leads of a component carried by said presenting means, said members having lead receiving grooves alined with an axis extending through the body of the component, and power means for operating said members with translation and oscillation about an axis in the course of movement of said presenting means toward and from the path of the inserter.

12. For use with a component inserting machine having a head including a cyclically operable former, means in said head movable relatively to the former for holding successive components with their leads in predetermined alinement thereon, and means mounted externally of said head for presenting successive components to said former when said holding means is inoperative, said presenting means including members arranged and adapted to engage and centralize the leads with respect to their component bodies.

13. In a component inserting machine, a fluid pressure operated inserter, fluid pressure operated means for clinching component leads installed by the inserter, and a source of fluid pressure having operative connections normally open to the inserter when closed to said lead clinching means, said connections including a valve responsive to build-up in pressure upon completion of the inserting stroke of the inserter to open said connection to the lead clinching means whereby the leads of a component are clinched only after being fully inserted.

14. In a machine for mounting components, a frame, an inserter reciprocably mounted therein, means supported by said frame for feeding components into position to be inserted by the inserter in a work piece, an anvil mounted on the frame to clinch portions of each inserted component projecting from the work piece, linkage interconnecting the inserter and the anvil to move the inserter to mount the component in the work piece and to move the anvil to clinch said projecting portions, a source of fluid pressure on said frame, and control means connected to said source for actuating said linkage to operate the inserter initially at a relatively low pressure and thereafter to operate said anvil at a relatively higher pressure.

15. In a component inserting machine having an inserter movable toward and from one side of a work piece and an anvil carrier movable toward and from the opposite side of the work piece to carry lead clinching anvils into and out of operative position adjacent to the leads installed by said inserter, fluid pressure operated means for operating said inserter and carrier in time relation, a piston movably mounted in said carrier for causing said anvils to bend and wipe the inserted leads, and means responsive to build-up in pressure upon completion of the inserting stroke of the inserter for actuating said piston when the carrier is adjacent to the work piece.

References Cited in the file of this patent

UNITED STATES PATENTS

| | | |
|---|---|---|
| 1,179,425 | Guttman | Apr. 18, 1916 |
| 1,859,951 | Blevney | May 24, 1932 |
| 1,983,384 | McClure | Dec. 4, 1934 |
| 2,139,185 | Engel | Dec. 6, 1938 |
| 2,303,976 | Bawcutt | Dec. 1, 1942 |
| 2,305,667 | Brentnall | Dec. 22, 1942 |
| 2,417,817 | Finn | Mar. 25, 1947 |
| 2,484,880 | Flood | Oct. 18, 1949 |
| 2,531,985 | Nasmith | Nov. 28, 1949 |
| 2,735,119 | Dodge | Feb. 21, 1956 |
| 2,746,041 | Heeley | May 22, 1956 |
| 2,754,994 | Cole | July 17, 1956 |
| 2,772,416 | Dorosz | Dec. 4, 1956 |
| 2,808,587 | Hancock | Oct. 8, 1957 |

FOREIGN PATENTS

| | | |
|---|---|---|
| 883,720 | Germany | July 20, 1953 |